United States Patent [19]

Tobita

[11] Patent Number: 5,023,840
[45] Date of Patent: Jun. 11, 1991

[54] SEMICONDUCTOR MEMORY DEVICE HAVING TESTING FUNCTION AND TESTING METHOD THEREOF

[75] Inventor: Youichi Tobita, Hyogo, Japan

[73] Assignee: Mitsubishi Denki Kabushiki Kaisha, Tokyo, Japan

[21] Appl. No.: 469,111

[22] Filed: Jan. 24, 1990

[30] Foreign Application Priority Data

Feb. 3, 1989 [JP] Japan .................................. 1-26149

[51] Int. Cl.[5] .............................................. G11C 29/00
[52] U.S. Cl. ................... 365/201; 365/189.07; 365/233
[58] Field of Search ............... 365/189.03, 200, 201, 365/189.11, 189.07, 233; 371/21.1, 21.4; 324/73 R

[56] References Cited

U.S. PATENT DOCUMENTS

| 4,571,503 | 2/1986 | Tobita ................................ 307/269 |
| 4,819,212 | 4/1989 | Nakai et al. ..................... 365/189.03 |
| 4,841,233 | 6/1989 | Yoshida .......................... 365/201 X |

FOREIGN PATENT DOCUMENTS

| 0260982A2 | 3/1988 | European Pat. Off. . |
| 3639169A1 | 7/1987 | Fed. Rep. of Germany . |
| 6382172 | 9/1986 | Japan . |

OTHER PUBLICATIONS

"Contrivance and Development of Sense Amplifier Which is the Key to the of a Large Capacity MOS RAM" [sic], *Nikkei Electronics* publication dated Jan. 8, 1989, pp. 110–133.

Hugh McAdams et al., "A 1-Mbit CMOS Dynamic RAM with Design-For Test Functions," *IEEE Journal of Solid State Circuits*, vol. SC-21, No. 5, Oct. 1986, pp. 635–642.

Primary Examiner—Joseph A. Popek
Attorney, Agent, or Firm—Lowe, Price, LeBlanc and Becker

[57] ABSTRACT

A semiconductor memory device comprises a high voltage detection circuit (20). A sense amplifier driving signal generating circuit (92) delays a word line driving signal (R) and outputs the delayed word line driving signal (R) as a sense amplifier driving signal ($\phi$s). An X decoder (300) applies the word line driving signal (R) to any of word lines (WL). A sense amplifier (510) amplifies potential difference between a bit line pair (BL, $\overline{BL}$) in response to the sense amplifier driving signal ($\phi$s). The high voltage detection circuit (20) generates a test signal (T) when high voltage is applied to an input terminal (81) during a test. A delay time of the sense amplifier driving signal generating circuit (92) is reduced in response to the test singal (T).

26 Claims, 17 Drawing Sheets

SEMICONDUCTOR MEMORY DEVICE HAVING TESTING FUNCTION AND TESTING METHOD THEREOF

BACKGROUND OF THE INVENTION

1. Field of the Invention

The present invention relates generally to semiconductor memory devices and a testing method thereof, and more particularly, to a semiconductor memory device which can be tested in a simple manner and to a testing method thereof.

2. Description of the Background Art

With the advance of manufacturing techniques of semiconductor integrated circuits and the users' requirements for reducing their prices, the degree of integration of semiconductor memory devices has been increased by about four times in about three years, and presently a dynamic random access memory (referred to as DRAM hereinafter) having capacity of 4M bit has been put to practical use.

In such a DRAM, we consider a testing time when, for example, the following test is performed. First, data of "0" is written in all the memory cells and data of "0" is read out from all memory cells. Then, the same is performed to data of "1" in 10 $\mu$ sec of cycle time. This cycle time corresponds to a maximum pulse width of a row address strobe signal $\overline{RAS}$. The testing time Tl in this case is represented by the following equation (1).

$$Tl = 4 \times 4 \times 10^6 \times 10 \ \mu sec = 160 \ sec \quad (1)$$

In this equation, "4" of the first occurrence corresponds to a writing of "0", a reading of "0", a writing of "1" and a reading of "1". In addition, the next "$4 \times 10^6$" corresponds to a memory capacity and the last "10" $\mu$ sec corresponds to a cycle time.

In an ordinary DRAM, the above test needs to be performed in four conditions, namely at maximum value 5.5V in an operating power supply voltage range, at minimum value 4.5V in the same, at high temperature 70° C. in an operating temperature range, and at low temperature 0° C. in the same. In this case, testing time T2 is represented by the following equation (2).

$$T2 = 160 \ sec. \times 4 = 640 \ sec. \quad (2)$$

The above value is extremely long as a testing time of an integrated circuit, which causes productivity to decrease and price to increase.

Furthermore, in practice, there are some cases in which defective portions can not be detected with the above items only. Therefore, it is necessary to perform a test which includes in combination, for example, timing conditions of input signals, an addressing order of address signals, and data patterns written into memory cells and the like. In such a case, the testing time becomes extremely long. The primary object of the present invention is to reduce a testing time of a semiconductor memory device with large capacity such as the above.

First, an example of a general DRAM will be described. FIG. 20 is a block diagram showing an entire structure of a conventional DRAM to which the present invention is also applied. In FIG. 20, a reading portion is indicated and a writing portion is not indicated.

In FIG. 20, in a memory cell array 100, a plurality of memory cells for storing information are arranged in rows and columns. An address buffer 200 receives external address signals A0 - An applied to external terminals p0 - pn from the external and generates internal address signals. An X decoder 300 decodes the internal address signal from the address buffer 200 and selects a corresponding row in the memory cell array 100. A Y decoder 400 decodes the internal address signal from the address buffer 200 and selects a corresponding row in the memory cell array 100. A sense amplifier and I/0 block 500 detects and amplifies information read out from memory cells of a single selected row in the memory cell array 100, and transmits the information selected from those information by the Y decoder 400 to an output amplifier 600. The output amplifier 600 amplifies the information transmitted from the sense amplifier and I/0 block 500 and outputs it to an output buffer 700. The output buffer 700 outputs to the external as an output data Dout the information applied from the output amplifier 600.

A control signal generation system 800 receives a column address strobe signal $\overline{CAS}$, a row address strobe signal $\overline{RAS}$ and a writing signal W, applied to external terminals 81–83 and generates various control signals to control the operational timing of each portion.

FIG. 21 is a diagram showing a structure of a memory cell array 100 shown in FIG. 20.

In FIG. 21, a plurality of bit line pairs BL and $\overline{BL}$ comprise folded bit lines. A plurality of word lines WL are arranged so as to intersect with a plurality of bit line pairs BL and $\overline{BL}$. At an intersection of each bit line BL and every other word line WL, a memory cell MC is provided, and at an intersection of each bit line $\overline{BL}$ and every other word line WL, a memory cell MC is provided.

Precharge/equalize circuits 110 are connected to each bit line pair BL and $\overline{BL}$. Each precharge/equalize circuit 10 balances a potential on a corresponding bit line pair BL and $\overline{BL}$, and precharges the bit line pairs BL and $\overline{BL}$ to a predetermined potential $V_B$. In addition, sense amplifiers 510 are connected to each bit line pair BL and $\overline{BL}$. Each sense amplifier 510 is activated in response to a first and a second sense amplifier activating signals $\phi A$ and $\phi B$ applied via a first and a second signal lines L1, L2, senses a potential difference on the corresponding bit line pair BL and $\overline{BL}$ and amplifies it differentially. Each of a plurality of bit line pairs BL, $\overline{BL}$ is connected to data input/output buses I/0 and $\overline{I/}$ via transfer gates Tl and T2. A decode signal is applied to each gate of transfer gates Tl, T2 from the Y decoder 400. In response to a decode signal from the Y decoder 400, a pair of the transfer gates Tl, T2 is turned on selectively, so that the corresponding bit line pair BL, $\overline{BL}$ is connected to the data input/output buses I/0 and $\overline{I/}$ .

FIG. 22 is a circuit diagram showing in detail a corresponding portion to a bit line pair BL, $\overline{BL}$ shown in FIG. 21.

In FIG. 22, a single word line WL and a memory cell MC provided at an intersection of the word line WL and a bit line BL are shown. The memory cell MC includes a selection transistor Qs comprised of n-channel insulated gate field-effect transistor (referred to as a n-FET hereinafter), and a memory capacitance Cs for storing information. One electrode of the memory capacitance Cs is connected to the bit line BL via a storage node Ns and the selection transistor Qs, and the other electrode is connected to a ground line. A gate electrode of the selection transistor Qs is connected to the word line WL.

The bit line pair BL and $\overline{BL}$ are connected to a power supply line L3 via n-FETs Q1 and Q2. A constant voltage $V_B$ that is about half of a power supply potential $V_{cc}$ is applied to the power supply line L3. When a logical or "H" level precharge signal $\phi p$ is applied to the gates of n-FETs Q1 and Q2 via a signal line 4, the bit line pair BL, $\overline{BL}$ are precharged to the potential $V_B$. Further, a n-FET Q3 is connected between the bit lines BL and BL. At the beginning of stand-by, when a "H" level equalizing signal $\phi e$ is applied to a gate of the n-FET Q3 via a signal line L5, a potential on the bit line pair BL, $\overline{BL}$ is balanced.

On the other hand, the sense amplifier 510 includes p-channel insulated gate field-effect transistors (referred to as a p-FET hereinafter) Q4 and Q5 and n-FET Q6 and Q7. The p-FET Q4 is connected between the first signal line L1 receiving a sense amplifier activating signal $\phi A$ and the bit line BL, and the p-FET Q5 is connected between the first signal line L1 and the bit line $\overline{BL}$. Further, the n-FET Q6 is connected between the bit line BL and the second signal line L2 receiving a sense amplifier activating signal $\phi B$, and the n-FET Q7 is connected between the bit line $\overline{BL}$ and the second signal line L2. Gates of the p-FET Q4 and the n-FET Q6 are connected to the bit line $\overline{BL}$, and gates of the p-FET Q5 and the n-FET Q7 are connected to the bit line BL.

Between the bit line BL, $\overline{BL}$ and ground lines, there are parasitic capacitances C1 and C2, respectively. The first signal line L1 is connected to a terminal for receiving a power supply potential $V_{cc}$ via a p-FET Q8, and the second signal line L2 is connected to a ground line via a n-FET Q9. A sense amplifier driving signal $\overline{\phi s}$ for controlling a timing operation of a sense amplifier is applied to a gate of the p-FET Q8, and a sense amplifier driving signal $\phi s$ for controlling a timing operation of a sense amplifier is applied to a gate of the n-FET Q9.

The potential $V_B$ is usually held at $\frac{1}{2}\cdot V_{cc}$. Voltage $V_{TP}$ is a threshold voltage of the p-FETs Q4 and Q5 and voltage $V_{TN}$ is a threshold voltage of the n-FETs Q6 and Q7.

Next, referring to a timing chart shown in FIG. 23, an operation of the DRAM in FIG. 20 to FIG. 22 will be explained. In FIG. 23, it is assumed that information of a logical "1" is stored in the memory cell MC and the logical "1" information stored in a memory cell MC is read out.

During the time period from the time t0 to t1, the n-FET Q1 - Q3 are turned on. Thus, the bit line pair BL and $\overline{BL}$ is coupled to the power supply line L3, so that its potential is hold at $V_B (=V_{cc}/2)$ and the potential between the bit lines BL and $\overline{BL}$ is balanced. At that time, potentials of the first and the second signal lines L1, L2 for activating the sense amplifier 510 are held at $V_{cc}/2+|V_{TP}|$ and $V_{cc}/2-V_{TN}$, respectively.

At the time of t2, the precharge signal $\phi p$ and the equalizing signal $\phi e$ attain the "L" level, thereby causing the n-FETs Q1 and Q2 to turn off. At the time of t3, when a word line driving signal R rises and is applied to the selected word line WL, the selection transistor Qs is turned on, and a charge stored in the storage node Ns moves onto the bit line BL. As a result, the potential on the bit line BL rises a little ( V). The amount of change of the voltage ( V) is determined by a capacitance value of the memory capacitance Cs, a capacitance value of a parasitic capacitance C1 of the bit line BL and a storage voltage of the storage node Ns by capacitive voltage division as is well understood, which amount ( V) is usually about 100-200 mV.

Next, at the time of t4, the sense amplifier driving signal $\overline{\phi s}$ rises and the sense amplifier driving signal $\phi s$ falls. Thus the p-FET Q8 and n-FET Q9 are turned on, so that the potential of the first signal line L1 starts rising and the potential of the second signal line L2 starts falling. Due to the rise and fall of the potential on the first and the second signal lines L1 and L2, a flip-flop circuit comprising the p-FETs Q4 and Q5 and the n-FET Q6 and Q7 starts a sense amplifier operation. As a result, the small potential difference V between the bit lines BL and $\overline{BL}$ is amplified. The rise of the potential of the bit line BL by V causes a n-FET Q7 to be turned on. As a result, the charge stored in the parasitic capacitance C2 of the bit line $\overline{BL}$ is discharged via the n-FET Q7, the second signal line L2 and the n-FET Q9, so that the potential of the bit line $\overline{BL}$ becomes about 0 V at the time of t5.

On the other hand, the fall of the potential of the bit line $\overline{BL}$ causes the p-FET Q4 to be turned on. As a result, the potential of he bit line BL rises to the $V_{cc}$ level. Therefore, the potential of the storage node Ns attains the high level ($V_{cc} - V_{TN}$) again, so that a logic level of the storage node Ns is reproduced.

The foregoing is a series of operations of reading information from the memory cell MC, amplifying and reproducing the information. When this series of operations terminates, the DRAM enters a stand-by state in preparation for a next operation.

First, at the time of t8, when a potential of the word line WL falls due to the fall of the word line driving signal R, the selection transistor Qs is turned off. Thus, the memory cell MC enters a stand-by state.

At the time of t10, sense amplifier driving signals $\phi s$, $\overline{\phi s}$ start falling and rising, respectively, and then at the time of t11, attain the "L" level, and the "H" level, respectively. Thus, the p-FET Q8 and n-FET Q9 are turned off. Further, at the time of t12, the equalizing signal $\phi e$ starts rising, thus causing the n-FETQ3 to be turned on so that the bit lines BL and $\overline{BL}$ are coupled to each other. As a result, a charge moves from the high level potential bit line BL to the low level potential bit line $\overline{BL}$, and at the time of about t13, both the bit lines BL and $\overline{BL}$ attain the same potential $V_B (=V_{cc}/2)$ At the same time, movement of charge occurs between the first and the second signal lines L1 and L2 in high impedance state and the bit lines BL and $\overline{BL}$. As a result, the potential levels of the first and the second signal lines Lq, L2 become $V_{cc}/2+|V_{TP}|$, $V_{cc}/2-V_{TN}$, respectively.

At the time of t14, the precharge signal $\phi p$ starts rising. Thus, n-FETs Q1 and Q2 are turned on and the bit line pair BL, $\overline{BL}$ is coupled to the power supply line L3. As a result, the potential level of the bit line pair BL, $\overline{BL}$ is stabilized and the DRAM waits for the next reading operation.

FIG. 24 is a circuit diagram showing a conventional clock generation circuit for generating a sense amplifier driving signal $\phi s$ in response to a word line driving signal R. Meanwhile, the word line driving signal R is a signal for rising a potential of the word line selected by an X decoder.

The clock generation circuit includes a plurality of inverter circuits 12-1 - 12-n. The plurality of inverter circuits 12-1 - 12-n are connected in series between an input terminal I1 and an output terminal O1. Each of the inverter circuits 12-1 - 12-n includes a p-FET Q10 and a n-FET Q11 connected in series between a power supply terminal vl and a ground line via a connecting point N1.

When the word line driving signal R is applied to the input terminal I1, the signal is inverted sequentially by the inverters 12-1 - 12-n, and is outputted from the output terminal 01 as the sense amplifier driving signal s. A time difference between the word line driving signal R and the sense amplifier driving signal $\phi$s is determined by the sum of a signal propagation delay time (referred to as a delay time hereinafter) in each inverter circuit 12-1 - 12-n. In accordance with a required time difference between the word line driving signal R and the sense amplifier signal $\phi$s, the number of the inverter circuits and a delay time of each of the inverter circuits are selected. The delay time is provided, for example, by a modification of the FET transmission conductance (gm) by changing sizes of gate width FETs Q10 and Q11.

FIG. 25 is a waveform diagram explaining timing of the word line driving signal R and the sense amplifier driving signal $\phi$s, and a potential change of the bit line BL and the second signal line L2.

Now it is assumed that, data of "0" is to be read out from the memory cell MC in FIG. 22. In FIG. 25, at the time of t0, when the word line driving signal R rises to the "H" level, a potential of the selected word line WL attains the "H" level. When the word line driving signal R reaches the threshold voltage VTN of the n-FET, the selection transistor Qs in the memory cell MC conducts and the data stored in the memory cell MC is read out onto the bit line BL. In this case, since the memory cell MC is assumed to store the data of "0", a potential of the storage node Ns in the memory cell MC is 0V. Thus, following the conductance of the selection transistor Qs, a charge moves from the bit line BL set at $\frac{1}{2}V_{cc}$ level to the storage node Ns. As a result, the potential of the bit line BL decreases. The decreasing rate of the potential of the bit line BL is determined by a transfer conductance of the selection transistor Qs and a capacitance value of the memory capacitance Cs, which is relatively slow.

If the operation of the sense amplifier 510 is started at the timing when the potential of the bit line BL falls down as low as possible, its operation will be more stable. However, if the starting time is late, an operational speed of the DRAM becomes slower. Therefore, at an appropriate time tl which is later by about 20ns than the time t0, the sense amplifier driving signal $\phi$s is applied. At the time tl, when the sense amplifier driving signal $\phi$s reaches the threshold value voltage $V_{TN}$, the n-FET Q9 (FIG. 22) starts conducting and a potential of the second signal line L2 starts decreasing. Thus, an operation of the sense amplifier 510 is started and a potential of the bit line BL decreases as the potential of the second signal line L2 decreases. Thus, the signal on the bit line BL is amplified.

As described above, it is preferred that a delay time from the time t0 to the time tl is shorter in order to increase an operational rate of the DRAM. The main factor for determining the delay time is an electric imbalance existing between the bit lines BL and $\overline{BL}$. The electric imbalance is caused by, for example, a difference of a threshold voltage between the n-FETs Q6 and Q7 shown in FIG. 22, a difference of a noise voltage applied from the adjacent circuits to the bit lines BL and $\overline{BL}$, and the like. If an operation of a sense amplifier is started at a time when a reading voltage from a memory cell exceeds a sum of imbalance value represented by voltage, an accurate amplifying operation is performed.

Since it is difficult to precisely evaluate such a limiting point of the time at which a sense amplifier does not malfunction, the time is in practice determined experimentally. However, such a time limit at which sense amplifier does not malfunction differs depending on conditions such as an accessing order, and a combination of data of "1" and "0". As it is generally difficult to find limits under all conditions through experiment, the time tl is in practice provided later than a time limit obtained through experiment.

FIG. 26 is an expanded diagram of FIG. 25 for facilitating the understanding of the above description. However, a waveform diagram of a potential of a second signal line L2 is not shown.

In FIG. 26, the times t20-t22 are time limits for an operation of a sense amplifier obtained in various conditions. The time t21 is the time limit obtained under the easiest condition and the time t22 is the time limit obtained under the toughest condition. However, these time limits are simply based on assumption, and only a certain time between the time t21 and the time t22 can be obtained experimentally. In FIG. 26, the time t20 is the typical time limit. In this way, the time t2 will in practice have a range of values. The above description is based on the assumption that properties of a plurality of memory cells are equal.

To the contrary, in a DRAM having a number of memory cells such as 4M bit memory, due to defects caused by dust and the like mixed during manufacturing process, a threshold voltage of a selection transistor in a memory cell sometimes becomes extremely high. In this case, a transfer conductance of a selection transistor decreases so that a potential of a bit line decreases at a slower rate. As a result, such time limit for which a sense amplifier does not malfunction is long.

The times t30-t32 show such time limit as a sense amplifier does not operate erroneously in the presence of a defective memory cell. The problem is that the time tl when a sense amplifier practically performs an amplifying operation is a little earlier than the time t32 of a time limit obtained under the toughest condition. In this case, depending on the conditions of data stored in adjacent memory cells and the like, a DRAM may or may not operate normally. The toughest condition is caused usually due to a combination of various conditions and it is very difficult for manufacturers to detect it within a limited time.

As a result, a DRAM having such defective memory cells is used by users. Therefore, when used in practice under a particular condition, the problem of an error operation of a DRAM exists.

SUMMARY OF THE INVENTION

An object of the present invention is to make it possible to test easily whether defective portions exist or not in a semiconductor memory device.

Another object of the present invention is to reduce a testing time of a large capacity semiconductor memory device.

A further object of the present invention is to provide a testing method that can easily detect whether defective portions exist or not in a semiconductor memory device.

A still another object of the present invention is to provide a testing method by which a semiconductor memory device having a large capacity can be tested in a short time period.

The semiconductor device according to the present invention is directed to a semiconductor memory device having external terminals, operating in response to signals applied to the external terminals, and comprising test signal generator, first function device, delay device and second function device.

The test signal generator generates a test signal in response to application of a signal of a predetermined condition differing from that which in a normal operation is applied to an external terminal. The first function device operates in response to the predetermined first signal. The delay device receives the first signal, delays the first signal by a predetermined delay time and outputs it as a second signal. The delay time is to change in response to the test signal. The second function device operates in response to the second signal outputted from the delay device.

In the semiconductor memory device according to the present invention, when, in testing, a signal of a predetermined condition differing from that of a normal operation is applied to an external terminal, a test signal is generated from a test signal generator. Thus, a timing of a second signal outputted from the delay device changes.

Since a predetermined delay time is nominally set to have an operating margin, when no defective portion exists in the semiconductor memory device, a second function device does not operate erroneously even if the timing of the second signal changes. However, when a defective portion exists in the semiconductor memory device, change of the timing of the second signal causes the second function device to operate erroneously. Accordingly, it can be detected whether defective portions exist or not by changing delay time in the delay means.

Description of the Preferred Embodiments

Figure 1:
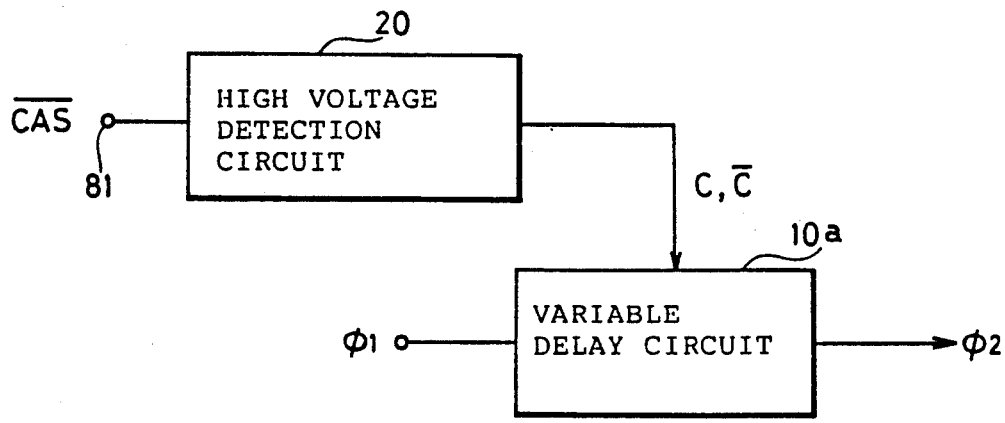
FIG. 1 is a block diagram showing a structure of a signal generation circuit according to one embodiment of the present invention.

Hereinafter, embodiments of the present invention will be described in detail by referring to the drawings.

Figure 20:
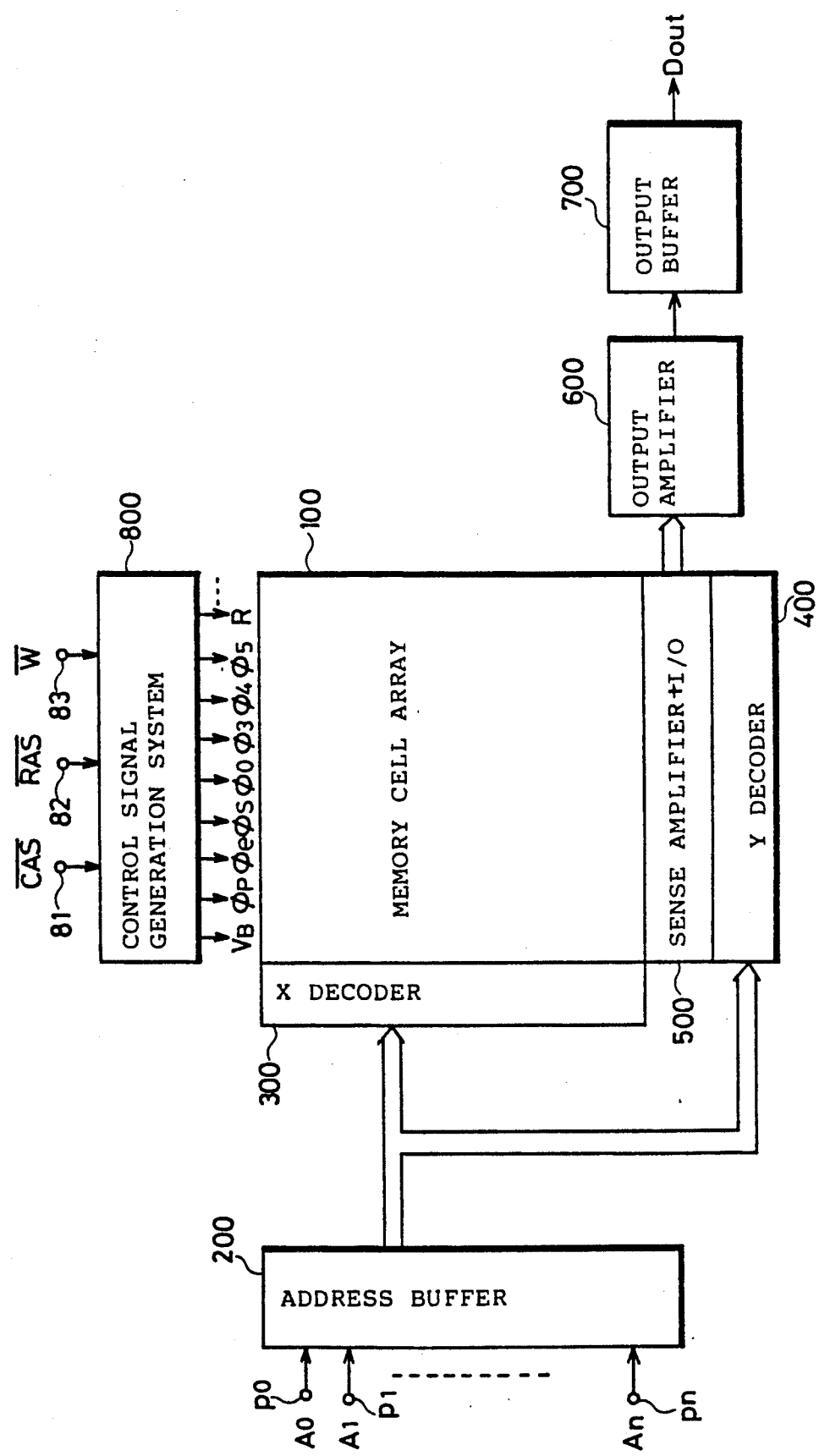
FIG. 20 is a block diagram showing a structure of a DRAM.
Figure 21:
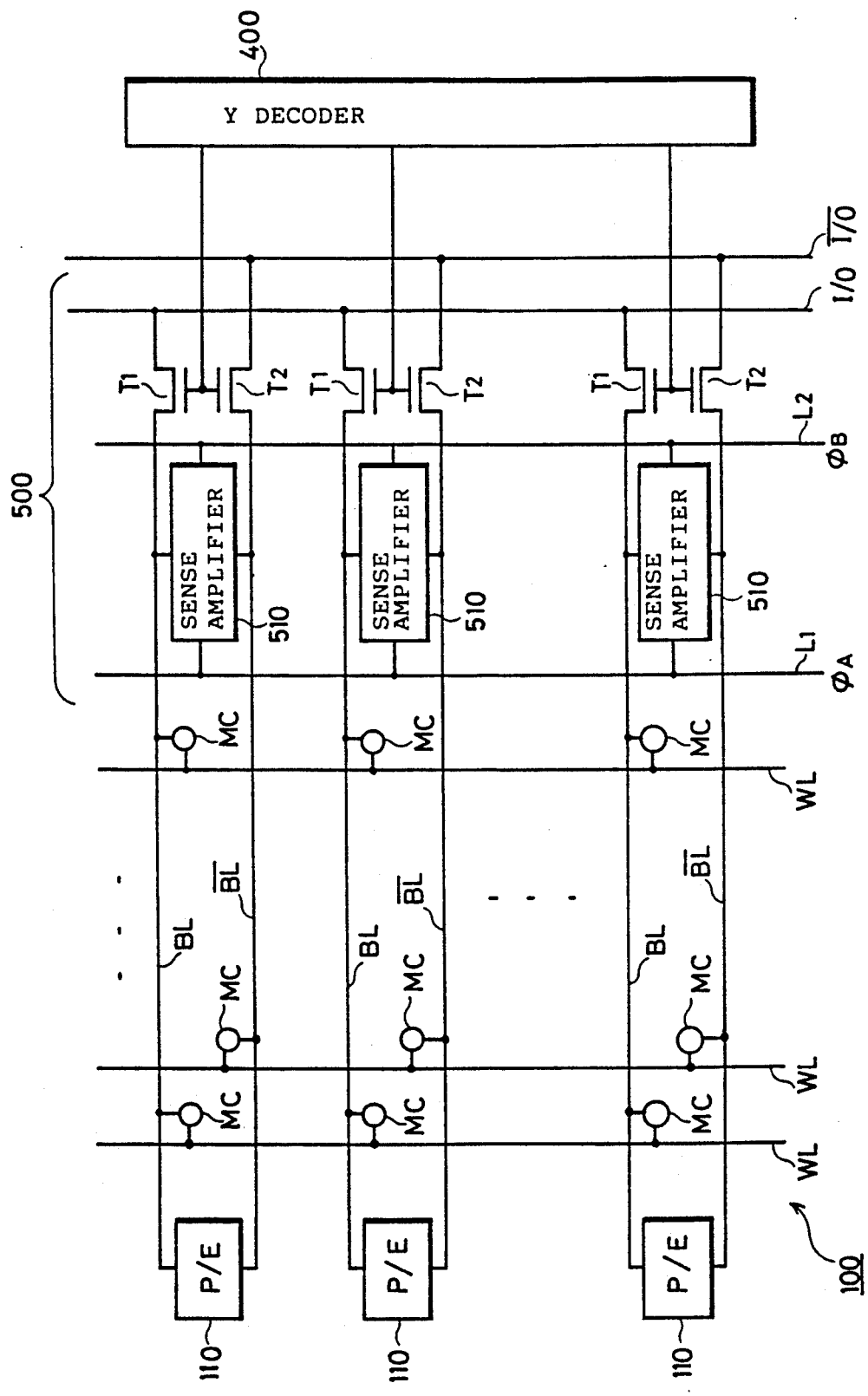
FIG. 21 is a diagram showing a structure mainly of a memory cell array of a DRAM.
Figure 22:
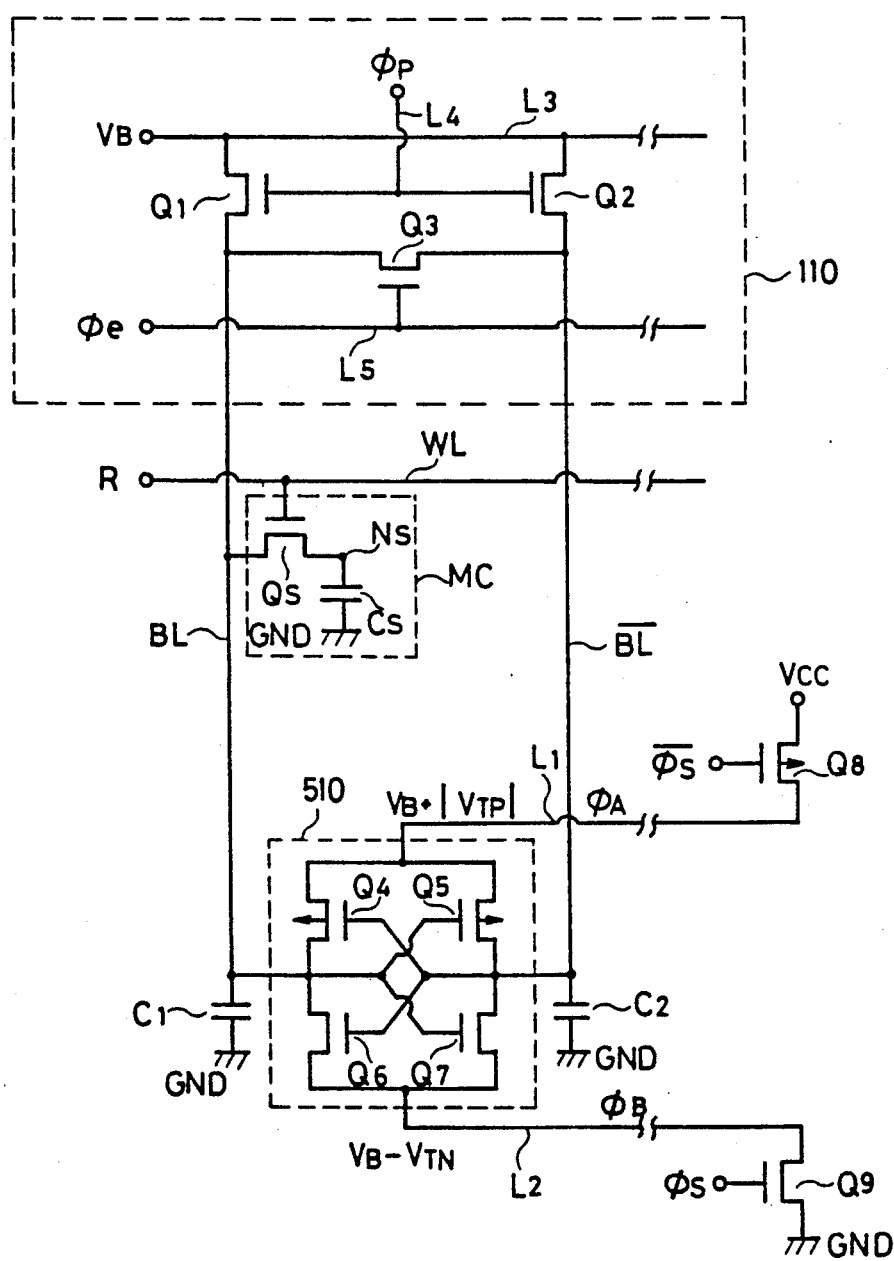
FIG. 22 is a detailed circuit diagram of a part of FIG. 21.
Figure 23:
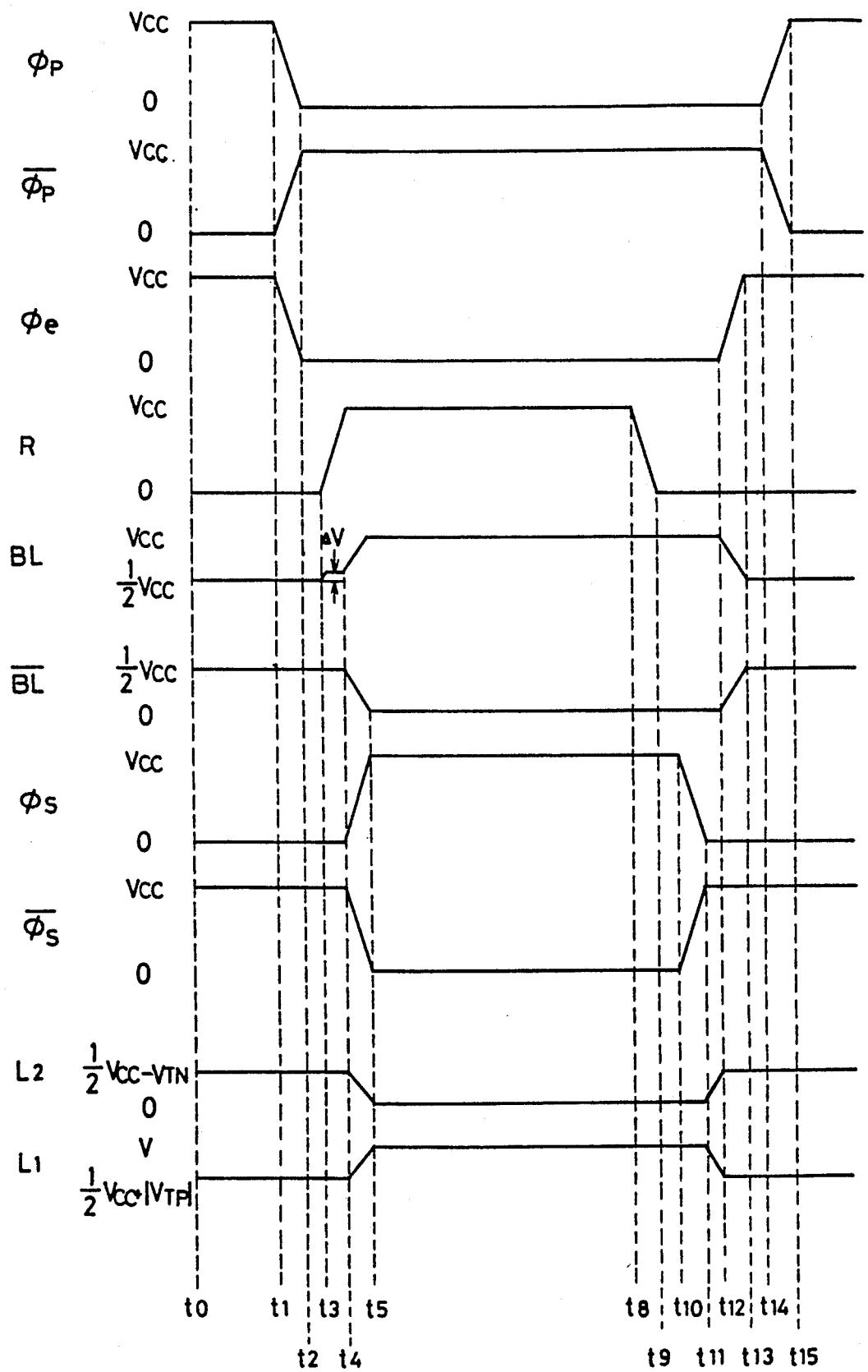
FIG. 23 is a timing chart explaining an operation of the circuit of FIG. 22.
Figure 24:
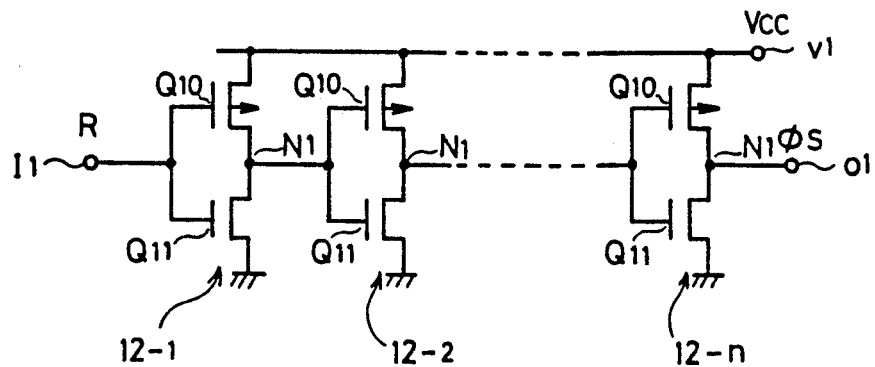
FIG. 24 is a circuit diagram showing an example of a structure of a clock generation circuit employed in a conventional memory device.
Figure 25:
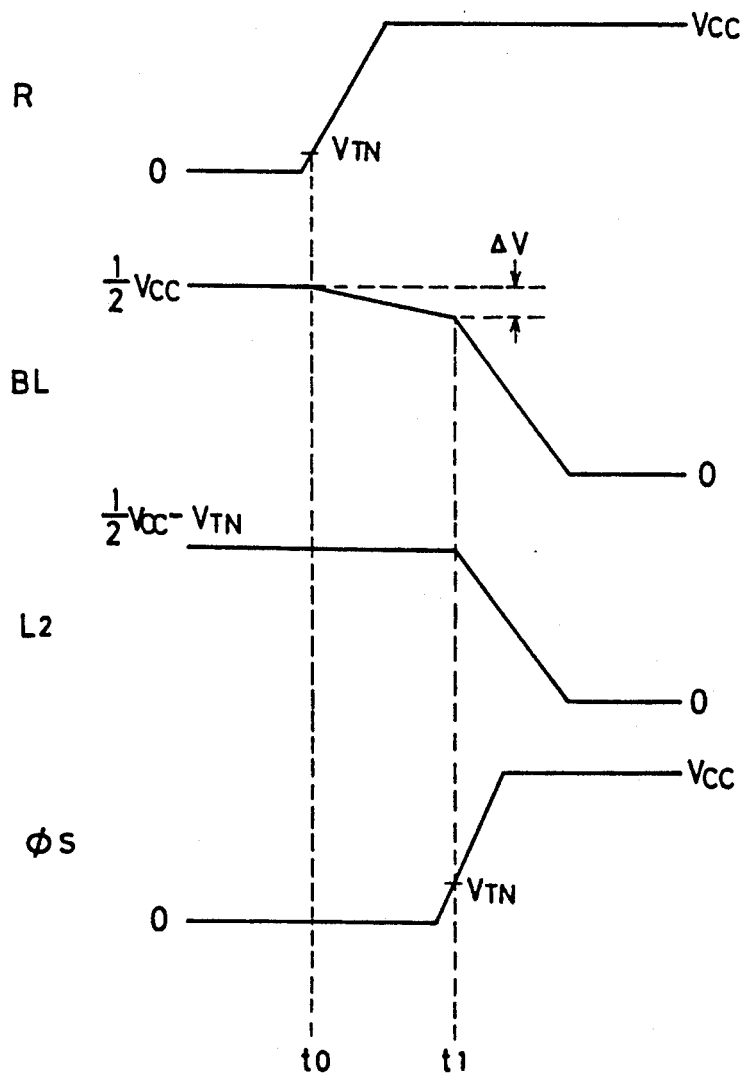
FIG. 25 is a waveform diagram explaining a timing mainly of a word line driving signal and a sense amplifier driving signal.

FIG. 1 is a block diagram showing a structure of a signal generating circuit included in a DRAM according to one embodiment of the present invention The structure of the other parts of the DRAM of the embodiment are the same as those shown in FIGS. 20-22.

In FIG. 1, a first signal $\phi 1$ corresponds, for example, to a word line driving signal R, and a second signal $\phi 2$ corresponds to a sense amplifier driving signal $\phi s$. A high voltage detection circuit 20 is connected to an external terminal 81 receiving a column address strobe signal $\overline{CAS}$. Upon receiving a predetermined high voltage at the external terminal 81, the high voltage detection circuit 20 generates control signals C and $\overline{C}$. A variable delay circuit 10a receives the first signal $\phi 1$, delays it by a predetermined delay time and outputs the delayed signal as the second signal $\phi 2$.

Figure 26:
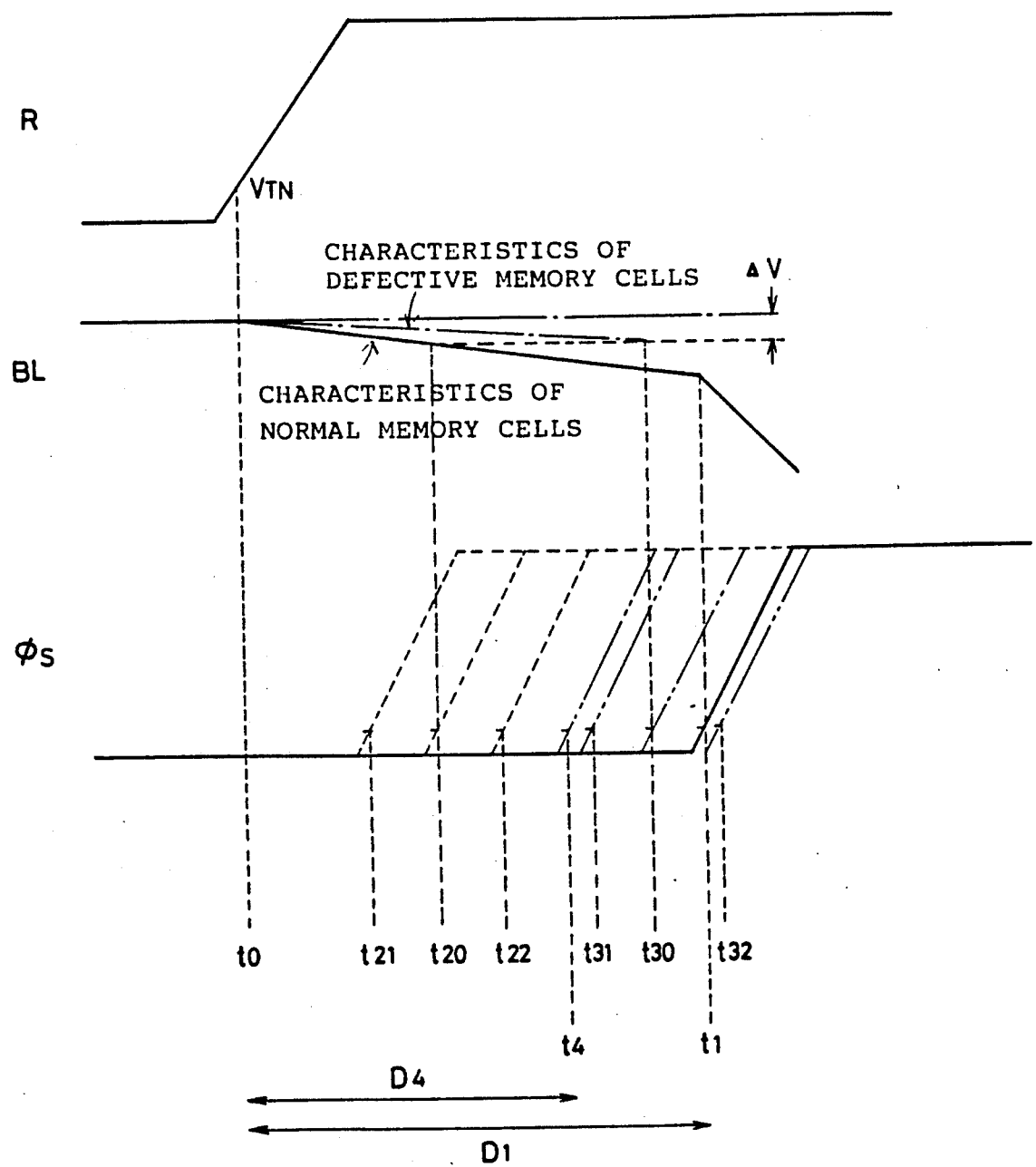
FIG. 26 is a waveform diagram explaining in detail a timing of a word line driving signal a sense amplifier driving signal.

If the first signal $\phi 1$ is a word line driving signal R and the second signal $\phi 2$ is the sense amplifier driving signal $\phi s$, a delay time is set to D1 (FIG. 26) so that the second signal $\phi 2$ rises at the time t1 after the first signal $\phi 1$ rises at the time t0 (see FIG. 26). On the other hand, when the control signals C and $\overline{C}$ are generated from the high voltage detection circuit 20, the delay time changes to D4 so that the second signal $\phi 2$ rises at the time t4 which is earlier than the time t30-32 shown in FIG. 26. Therefore, if defective portions exist in the DRAM, the sense amplifier malfunctions.

Accordingly, in test, by applying a high voltage to the external terminal 81, it can be detected very easily whether the DRAM has defective properties or not.

Figure 2:
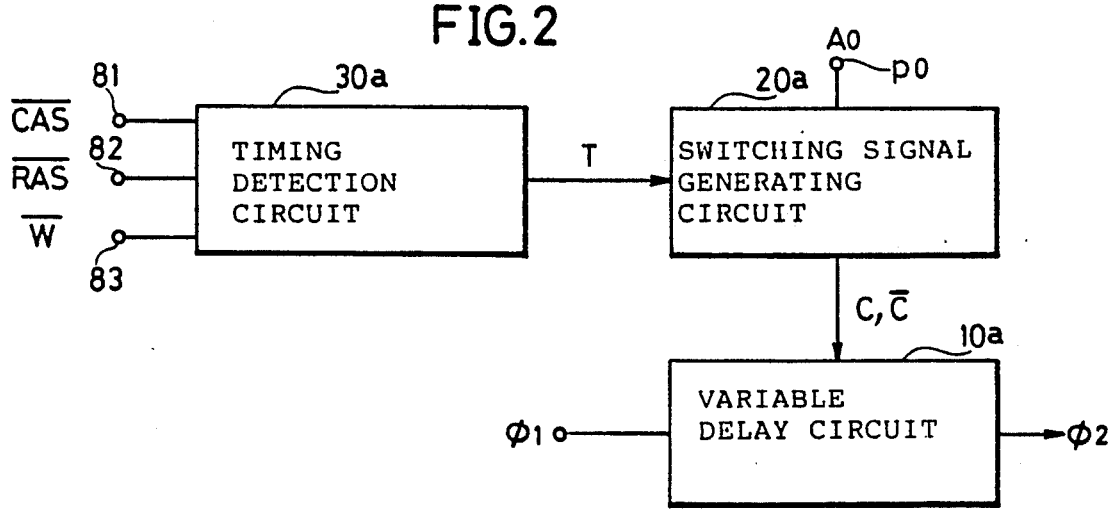
FIG. 2 is a block diagram showing a structure of a signal generation circuit according to another embodiment of the present invention.

FIG. 2 is a block diagram showing a structure of a signal generating circuit included in a DRAM according to another embodiment of the present invention.

In FIG. 2, a timing detection circuit 30a is connected to an external terminal 81 receiving a column address strobe signal $\overline{CAS}$, to an external terminal 82 receiving a row address strobe signal $\overline{RAS}$, and to an external terminal 83 receiving a writing signal $\overline{W}$. The timing detection circuit 30a generates a test signal T when timing of the column address strobe signal $\overline{CAS}$, the row address strobe signal $\overline{RAS}$ and the writing signal $\overline{W}$ is different in a predetermined manner from ordinary timing, example, in case that the row address strobe signal $\overline{RAS}$ and the writing signal $\overline{W}$ are at the "L" level when the column address strobe signal CAS falls to the "L" level, a test signal T is generated.

A switching signal generating circuit 20a is supplied with an external address signal A0 via an external terminal p0, as well as the test signal T from the timing detection circuit 30a.

When the external address signal A0 is at the "H" level, the switching signal generating circuit 20a generates control signals C and $\overline{C}$ in response signal T. In response to the control signals C and $\overline{C}$, a delay time of a variable delay circuit 10a is reduced.

While in the embodiment shown in FIG. 1, a testing operation is performed when a voltage applied to the external terminal 81 is higher than that in an ordinary operation, in the embodiment shown in FIG. 2, a testing operation is performed when the timing of the column address strobe signal $\overline{CAS}$, the row address strobe signal $\overline{RAS}$ and the writing signal $\overline{W}$, applied to the external terminals 80-83, respectively, is different from that in an ordinary operation.

Figure 3:
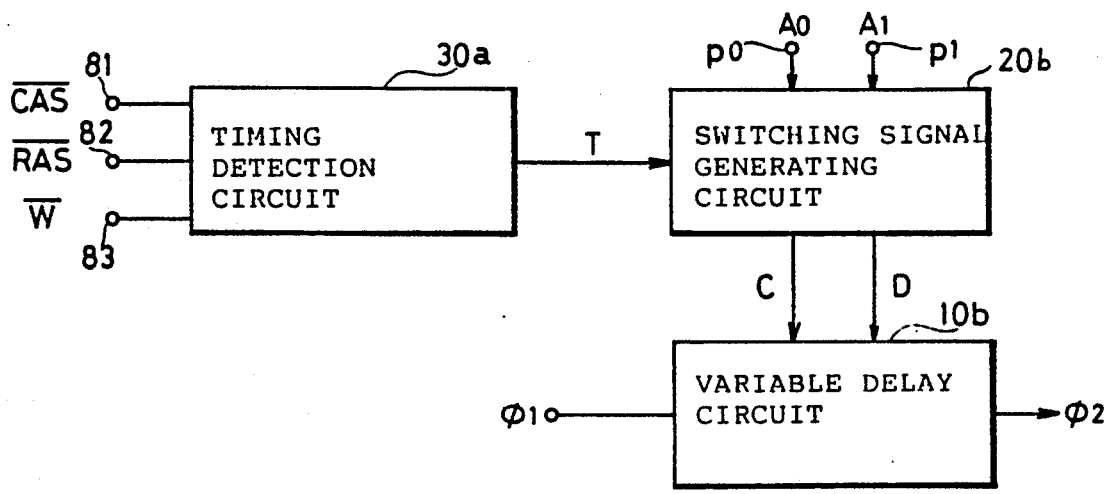
FIG. 3 is a block diagram showing a structure of a signal generation circuit according to a further embodiment of the present invention.

FIG. 3 is a block diagram showing a structure of a signal generating circuit included in a DRAM according to a further embodiment of the present invention.

In FIG. 3, a timing detection circuit 30a is the same as the timing detection circuit 30a in the embodiment shown in FIG. 2. A switching signal generating circuit 20b is supplied with an external address signals A0 and A1 via external terminal p0 and p1 as well as a test signal from the timing detection circuit 30a. The switching signal generating circuit 20b is responsive to a test signal T for generating control signals C and D in accordance with the external address signals A0 and A1. A variable delay circuit 10b changes its delay time in three or four steps in accordance with control signals C and D.

Accordingly, in the embodiment shown in FIG. 3, a test can be performed in various conditions.

Figure 4:
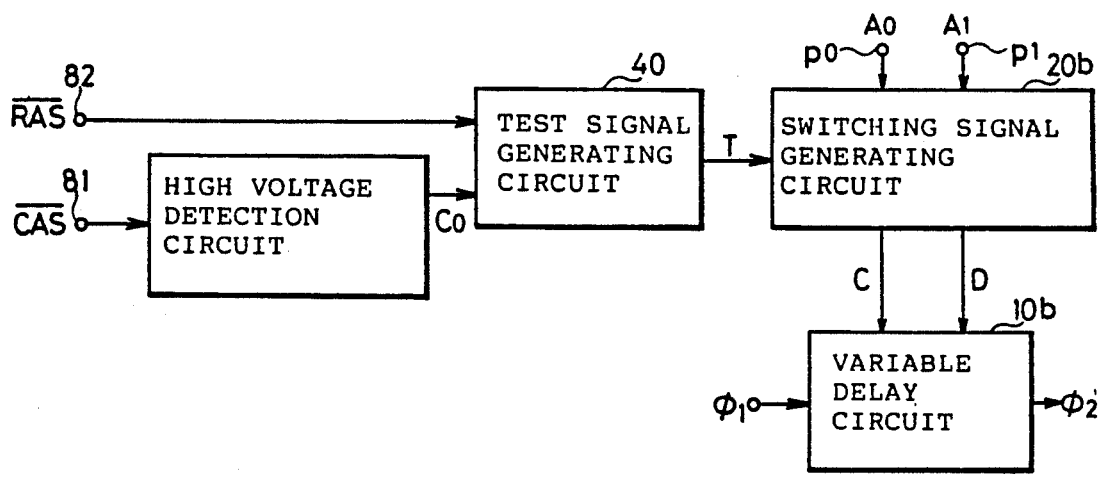
FIG. 4 is a block diagram showing a structure of a signal generation circuit according to still another embodiment of the present invention.

FIG. 4 is a block diagram showing a structure of a signal generating circuit included in a DRAM according to still another embodiment of the present invention.

In FIG. 4, a high voltage detection circuit 20 is the same as the high voltage detection circuit 20 shown in FIG. 1. Accordingly, when a high voltage is applied to an external terminal 81, a control signal CO is generated. A test signal generating circuit 40 is responsive to the control signal CO from the high voltage detection circuit 20 for generating a test signal T, when a row address strobe signal $\overline{RAS}$ applied to an external terminal is at the "L" level. A switching signal generating circuit 20b and a variable delay circuit 10b are the same as the switching signal generating circuit 20b and the variable delay circuit 10b shown in FIG. 3, respectively.

Figure 5:
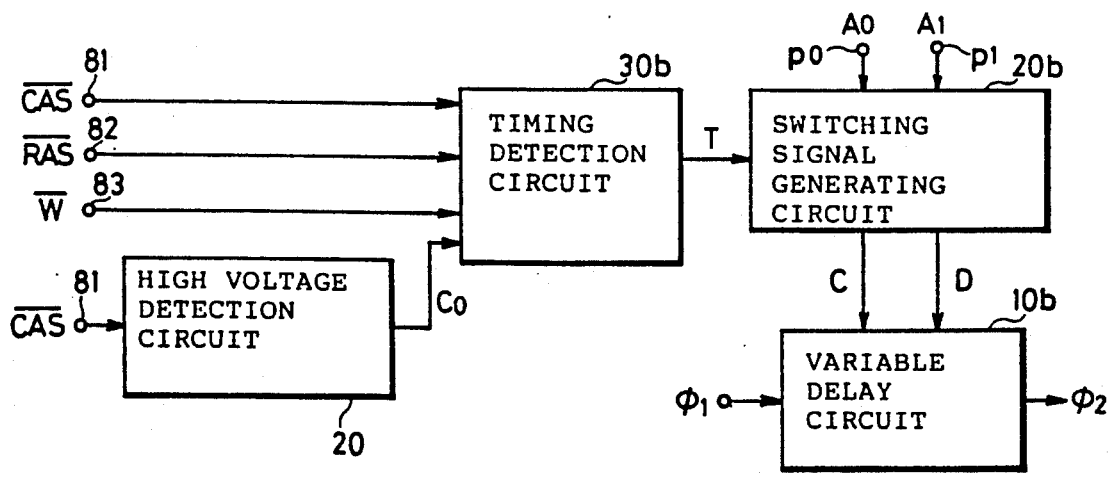
FIG. 5 is a block diagram showing a structure of a signal generation circuit according to still a further embodiment of the present invention.

FIG. 5 is a block diagram showing a structure of a signal generating circuit included in a DRAM according to a still further embodiment of the present invention.

In FIG. 5, a high voltage detection circuit 20 is the same as the high voltage detection circuit 20 shown in FIG. 1. That is, when a high voltage is applied to an external terminal 81, a control signal CO is generated from the high voltage detection circuit 20. The control signal CO is then latched to the high voltage detection circuit 20. A timing detection circuit 30b is responsive to the control signal CO for generating a test signal T, when a timing of a column address strobe signal $\overline{CAS}$, a row address strobe signal $\overline{RAS}$ and a writing signal $\overline{W}$ applied to external terminals 81-83, respectively, are different from that in an ordinary operation. A switching signal generating circuit 20b and a variable delay circuit 10b are the same as the switching signal generating circuit respectively, variable delay circuit 10b shown in FIG. 3, In general, a DRAM test is performed by a manufacturer. Therefore, when the user uses the DRAM, it is necessary that the DRAM is adapted such that it does not enter a test operating state easily.

On the other hand, in general semiconductor memory devices, the number of external terminals is required to be minimized to increase mounting density in use for instance, in a PC board. Therefore, it is not preferable to provide additional external terminals to set the semiconductor memory device in a test operating state. Accordingly, in the embodiments of the present invention, the following processes are used to set a DRAM in a test operating state without providing additional external terminals.

(1) To set voltage applied to an external terminal at the voltage outside the range in an ordinary use.

(2) To set timing of input signals applied external terminals at timings outside the range in an ordinary use.

(3) To combine the processes (1) and (2).

The embodiment shown in FIG. 1 corresponds to the process (1) and the embodiments shown in FIGS. 2 and 3 to the process (2). The embodiments shown in FIGS. 4 and 5 to the process (3).

Particularly, in the embodiment shown in FIG. 5, in an ordinary use of a DRAM, the DRAM is set to a testing state only when both the voltage condition and the timing condition applied to the external terminals are provided, so that due to the electric noise and the like, the DRAM does not enter its testing state easily. Therefore, in an ordinary use, no testing operation will be performed by accident.

A structure of a circuit generating control signal for controlling a delay time of a variable delay circuit is not limited to those shown in FIGS. 1-5, but other structures may be used as long as they generate control signals in response to the fact that a state of a signal applied to an external terminal has entered a predetermined state which is different from a state in an ordinary operation.

Figure 6:
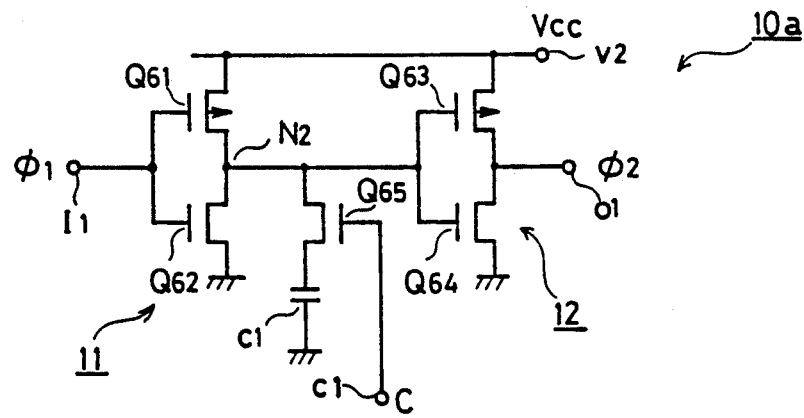
FIG. 6 is a circuit diagram showing an example of a structure of a variable delay circuit.

FIG. 6 is a circuit diagram showing one example of the structures of the variable delay circuits 10a shown in FIGS. 1 and 2.

In FIG. 6, two inverter circuits 11 and 12 are connected in series between an input terminal I1 and an output terminal 01 via a node N2. The inverter circuit 11 includes a p-FET Q61 and an n-FET Q62. The inverter circuit 12 includes a p-FET Q63 and an n-FET Q64. An n-FET Q65 and a capacitance Cl are connected in series between the node N2 and a ground line. A gate of an n-FET Q65 is connected to a control terminal cl receiving a control signal C.

In an normal operation, the control signal C applied to the control terminal cl attains the "H" level and the n-FET Q65 is turned on so that the capacitance Cl operates as a load capacitance in the inverter circuit 11. As a result, the operational speed of the inverter circuit 11 is established. With this state, time relation between a word line driving signal R and a sense amplifier driving signal $\phi s$ is determined.

In test, the control signal C applied to the control terminal cl attains the "L" level so that the n-FET Q65 is turned off. As a result, it causes the load capacitance of the inverter circuit 11 to be smaller, so that the inverter circuit 11 gains in speed. Therefore, it becomes possible to set a rise time of the sense amplifier driving signal $\phi s$ at the time t4 shown in FIG. 26.

It is also possible to adjust a rise time of a second signal $\phi 2$ by connecting a load capacitance to outputs of a plurality of inverter circuits.

Figure 7:
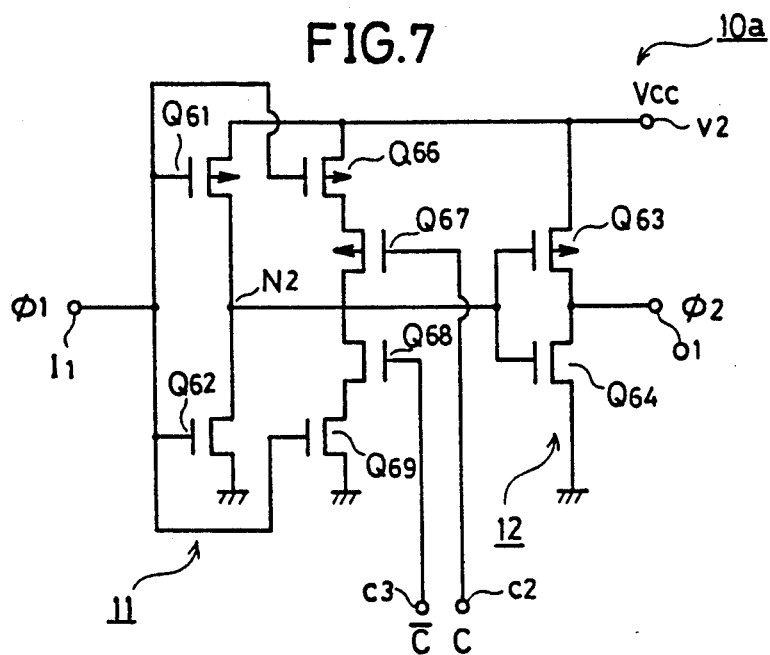
FIG. 7 is a circuit diagram showing another example variable delay circuit.

FIG. 7 is a circuit diagram showing another example of the structures of the variable delay circuits 10a shown in FIGS. 1 and 2.

In the variable delay circuit 10a shown in FIG. 7, a p-FETs Q66 and Q67 are connected in series between a power supply terminal v2 and a node N2, and n-FETs Q68 and Q69 are connected in series between a ground line and the node N2. A gate of the p-FET Q67 is connected to a control terminal c2 receiving a control signal C, and a gate of the n-FET Q68 is connected to a control terminal c3 receiving a control signal $\overline{C}$. The p-FET Q66 and the n-FET Q69 operate as auxiliary transistors of an inverter circuit 11.

In an ordinary operation, the control signal C is at the "H" level and the control signal $\overline{C}$ is at the "L" level, so that the p-FET Q67 and the n-FET Q68 are turned off. With this state, time relation between a word line driving signal R and a sense amplifier driving signal $\phi s$ shown in FIG. 26 is determined.

In test, the control signal C is at the "L" level and the control signal $\overline{C}$ is at the "H" level, so that the p-FET Q67 and the n-FET Q68 are turned on. As a result, the p-FET Q66 and the n-FET Q69 operate simultaneously with the operation of the inverter circuit 11, thereby causing the driving capability of the inverter circuit 11 to increase, so that the inverter circuit 11 gains its operational speed. Accordingly, it becomes possible to set a rise time of the sense amplifier driving signal $\phi s$ at the time t4 shown in FIG. 26.

Although in the foregoing embodiments, however, one p-FET and one n-FET and are provided as auxiliary transistors of the inverter circuit, a plurality of FETs may be provided as auxiliary transistors to facilitate the adjustment of a rise time of a second signal $\phi 2$. In this case, it is necessary to increase the number of control signals corresponding to the number of auxiliary transistors. Either the p-FET or the n-FET may be provided. Furthermore, auxiliary transistors may be added to outputs of a plurality of inverter circuits.

Figure 8:
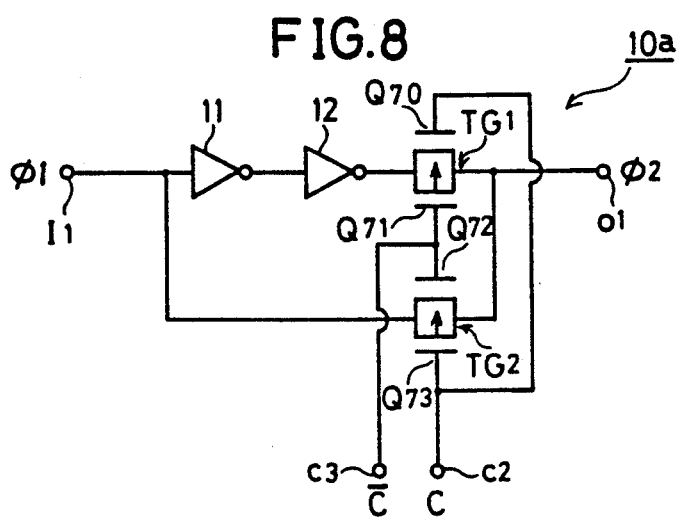
FIG. 8 is a circuit diagram showing a further example of a structure of a variable delay circuit.

FIG. 8 is a circuit diagram showing a further example of the structure of the variable delay circuit 10a shown in FIGS. 1 and 2.

In FIG. 8, a transmission gate TG1 comprised of an n-FET Q70 and a p-FET Q71 is connected between an inverter circuit 12 and an output terminal 01. Furthermore, a transmission gate TG2 comprised of an n-FET Q72 and a p-FET Q73 is connected between an input terminal I1 and the output terminal 01. Gates of the n-FET Q70 and the p-FET Q73 are connected to a control terminal c2. Gates of the p-FET Q71 and the n-FET Q72 are connected to a control terminal c3.

In an ordinary operation, a control signal C is at the "H" level and a control signal $\overline{C}$ is at the "L" level, so that the transmission gate TG1 is conductive and the transmission gate TG2 is non-conductive. As a result, a first signal $\phi 1$ applied to the input terminal I1 is transmitted to the output terminal 01 via inverters 11 and 12, and the transmission gate TG1. With this state, time relation between a word line driving signal R and a sense amplifier driving signal $\phi s$ is determined as shown in FIG. 26.

In test, the control signal C is at the "L" level and the control signal $\overline{C}$ is at the "H" level, so that the transmission gate TG1 is non-conductive and the transmission gate TG2 is conductive. As a result, a first signal $\phi 1$ applied to the input terminal I1 is transmitted to the output terminal 01 via the transmission gate TG2. In this case, due to the omission of delay time of the inverters 11 and 12 of the second stage, the inverters gain in speed. Accordingly, it becomes possible to set a rise time of the sense amplifier driving signal $\phi s$ at the time t4 shown in FIG. 26.

In the above embodiment, the delay time is adjusted by a pair of inverter circuits 11 and 12. However, it may be adjusted by more pairs of inverter circuits. For example, a plurality of pairs of inverter circuits may be connected in parallel, so that a plurality of delay times can be obtained. In this case, it is necessary to increase the number of control signals according to the number of pairs of inverter circuits.

Figure 9:
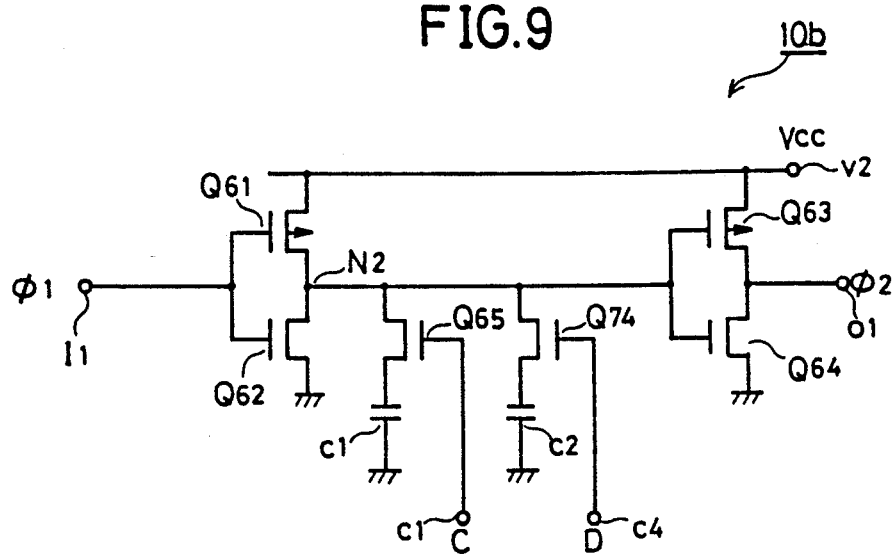
FIG. 9 is a circuit diagram showing still another example of a structure of a variable delay circuit.

FIG. 9 is a circuit diagram showing one example of the structures of the variable delay circuits 10b shown in FIGS. 3-5.

In the variable delay circuit 10b in FIG. 9, an n-FET Q74 and a capacitance C2 are further connected between a node N2 and a ground line. A gate of the n-FET Q74 is connected to a control terminal c4 receiving a control signal D. The structures of the other parts of the variable delay circuit 10b are the same as those of the variable delay circuit 10a shown in FIG. 6.

The variable delay circuit 10b establishes, according to the control signals C and D applied to control terminals cl and c4, a state in which the load capacitances Cl and C2 separated from the node N2, a state in which only the load capacitance Cl is connected to the node N2, a state in which only the load capacitance C2 is connected to the node N2, and a state in which both of the load capacitances Cl and C2 are connected to the node N2.

Accordingly, with the variable delay circuit 10b, it becomes possible to set a rise time of a second signal $\phi 2$ in two or three stages. It is also possible to connect three or more load capacitances to the node N2.

The structure of the variable delay circuit is not limited to those shown in FIGS. 6-9, but other structures may be used. For example, a variable delay circuit may be constructed by combining two or three of the circuits shown in FIGS. 6-9.

Figure 10:
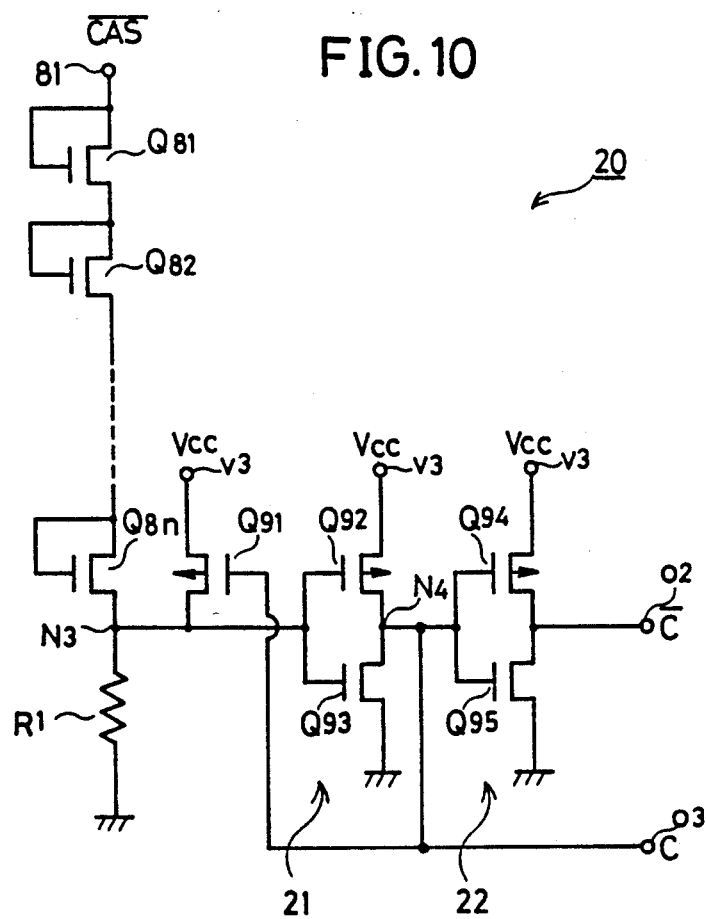
FIG. 10 is a circuit diagram showing a structure of a high voltage detection circuit.

FIG. 10 is a circuit diagram showing one example of structures of the high voltage detection circuits 20 shown in FIGS. 1, 4 and 5.

In FIG. 10, a plurality of n-FETs Q81 - Q8n are connected in series between an external terminal 81 receiving a column address strobe signal $\overline{CAS}$ and a node N3. Each gate of the n-FETs Q81 - Q8n is connected to its drain. The node N3 is grounded through a resistance element Rl having a relatively high resistance value. A p-FET Q91 is connected between the node N3 and a power supply terminal v3. The node N3 is connected to an output terminal 02 via two inverter circuits 21 and 22.

The inverter circuit 21 includes a p-FET Q92 connected between the power supply terminal v3 and a node N4, and an n-FET Q93 connected between the node N4 and the ground line. The inverter circuit 22 includes a p-FET Q94 connected between the power supply terminal v3 and the output terminal 02, and an n-FET Q95 connected between the output terminal 02 and the ground line. The node N4 is connected to a gate of the p-FET Q91 and an output terminal 03. A Control signal $\overline{C}$ is outputted from the output terminal 02, and a control signal C is outputted from the output terminal 03.

The operation of the high voltage detection circuit 20 will now be explained. Assuming that a threshold voltage $V_{TH}$ of an n-FET is 0.5V, and the number of n-FETs Q81 - Q8n connected between the external terminal 81 and the node N3 is 13, it is necessary to apply a voltage greater than 6.5V (0.5V × 13) between the external terminal 81 and the node N3 in order to render the n-FETs Q81 - Q8n conductive.

In DRAM, the maximum of the potential of an input signal of the "H" level is defined as 6.5V. The node N3 is grounded via a resistance element Rl, so that its potential is usually at the "L" level. Therefore, the p-FET Q92 is turned on, so that the potential of the output terminal 03 is at the "H" level. The n-FET Q95 is turned on, so that the potential of the output terminal 02 is at the "L" level. Accordingly, the control signal C is at the "H" level and the control signal $\overline{C}$ is at the "L" level, thereby rendering, for example, the p-FET Q67 and the n-FET Q68 in FIG. 7 non-conductive and causing the second signal $\phi 2$ to rise later.

A voltage greater than 6.5 V is then applied to the external terminal 81. For example, when 10 V is applied to the external terminal 81, the potential of the node N3 is 3.5V (10V−6.5V), thereby causing the n-FET Q93 to be turned on, so that the potential of the node N4 is at the "L" level. As a result, the p-FET Q94 is turned on, so that the potential of the output terminal 02 is pulled up to the power supply potential $V_{cc}$. Accordingly, the control signal C is at the "L" level and the control signal $\overline{C}$ is at the "H" level, thereby causing, for example, the p-FET Q67 and the n-FET Q68 in FIG. 7 to be conductive and the second signal $\phi 2$ to rise later.

The control signal C attains the "L" level, thereby causing the p-FET Q91 to be turned on. Therefore, once a high voltage is applied to the external terminal 81, the states of the control signals C and $\overline{C}$ are held by the p-FET Q91 even if no more high voltage is applied thereafter. That is, even if the column address strobe signal $\overline{CAS}$ is added as a pulse to the external terminal 81 so that its voltage attains 0V during the test period, the test state is maintained.

Conversely, in order to release the test state, it is necessary to once turn off the power supply supplied to the DRAM and pull a voltage applied to the power supply potential v3 down to 0 V. As a result, the potential of the node N3 becomes the ground potential, so that an ordinary operation becomes possible.

In the circuit shown in FIG. 10, the external terminal 81 receiving the column address strobe signal $\overline{CAS}$ is used as an external terminal applied with a high voltage.

However, other external terminals such as the external terminal 83 receiving a writing signal $\overline{W}$ may be used.

Figure 11:
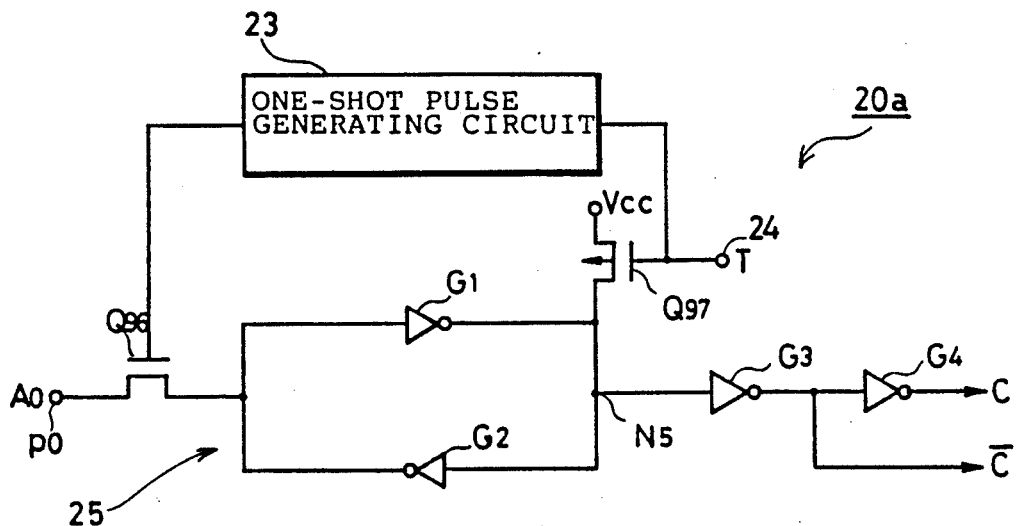
FIG. 11 is a circuit diagram showing an example of a structure of a switching signal generation circuit.

FIG. 11 is a circuit diagram showing one example of the structure of the switching signal generating circuit 20a shown in FIG. 2.

The switching signal generating signal 20a includes an n-FET Q96, a p-FET Q97, inverter circuits G1 - G4 and a one-shot pulse generating circuit 23. The one-shot pulse generating circuit 23 detects a change from the "L" level to the "H" level of a test signal T applied to an input terminal 24, and generates a positive single pulse. The inverter circuits G1 and G2 constitute a latch circuit.

In an ordinary operation, the test signal T is at the "L" level, so that the output of the one-shot pulse generating circuit 23 is at the "L" level so that the n-FET Q96 is non-conductive. As a result, an address signal A0 applied to an external terminal p0 is not inputted to the latch circuit 25. Furthermore, the p-FET Q97 is conductive, thereby fixing the potential of a node N5 at the "H" level. As a result, a control signal $\overline{C}$ outputted from the inverter G3 attains the "L" level and the control signal C outputted from the inverter circuit G4 attains the "H" level, thereby causing, for example, a second signal $\phi 2$ to rise later.

In test, the test signal T changes from the "L" level to the "H" level thereby causing the one-shot pulse generating circuit 23 to generate single pulses, so that the n-FET Q96 is conductive in a certain period. As a result, the address signal A0 being applied to the external terminal p0 is fetched into the latch circuit 25 and is latched. At this time, the p-FET Q97 is turned on. When the address signal A0 is at the "H" level ("1"), the potential of the node N5 is at the "L" level, so that the control signal $\overline{C}$ is at the "H" level and the control signal C is at the "L" level. Accordingly, for example, in FIG. 9, the second signal $\phi 2$ rises earlier. On the other hand, when the address signal A0 is at the "L" level ("0"), the control signal $\overline{C}$ remains at the "L" level and the control signal C remains at the "H" level.

Figure 12:
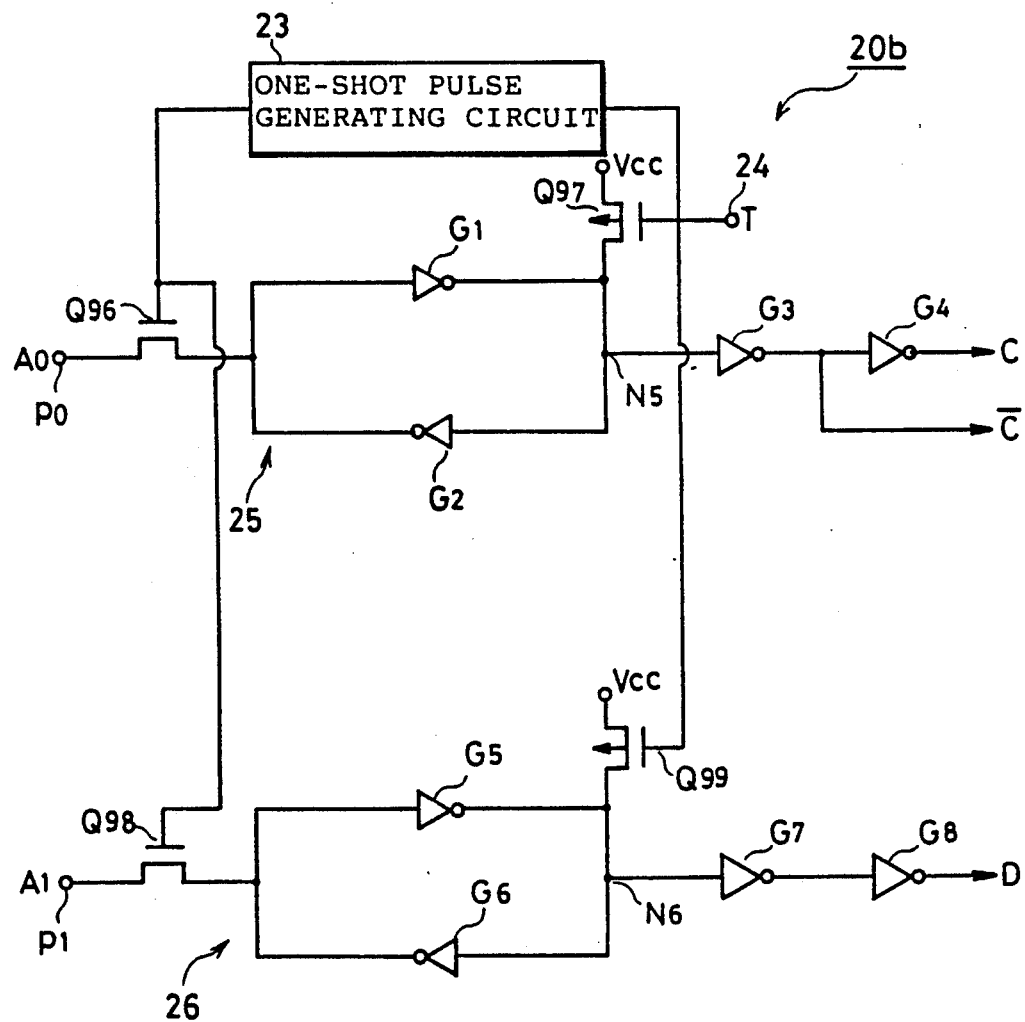
FIG. 12 is a circuit diagram showing another example of a structure of a switching signal generation circuit.

FIG. 12 is a circuit diagram showing one example of the structures of the switching signal generating circuits 20b shown in FIGS. 3-5.

An n-FET Q98, a p-FET Q99, a latch circuit 26 and inverter circuits G7 and G8 are further provided in the switching signal generating circuit 20b. The latch circuit 26 is formed of inverter circuits G5 and G6. The other parts of the switching signal generating circuit 20b are the same as those in the switching signal generating circuit 20a shown in FIG. 11.

In an ordinary operation, a test signal T is at the "L" level, p-FETs Q 97 and Q99 to be tuned off. As a result, control signals C and D are at the "H" level. Accordingly, for example, in FIG. 9, the n-FETs Q65, Q74 is turned on and the second signal $\phi 2$ rises later.

In test, since the test signal T attains the "H" level, an address signal AO applied to an external terminal pO is fetched into a latch circuit 25 and an address signal Al applied to an external terminal p1 is fetched into a latch circuit 26. Therefore, the control signal C becomes an inverted signal of the address signal AO, and a control signal D becomes an inverted signal of the address signal Al. Accordingly, for example, according to the address signals AO and Al, each of the n-FETs Q65, Q74 in FIG. 9 becomes conductive or non-conductive. Therefore, if the capacitance values of a capacitance C1 and a capacitance C2 are equal, it becomes possible to set a rise time of the second signal $\phi 2$ in a two-divided manner during a test. If the capacitance values of the capacitance C1 and the capacitance C2 are different, it will be possible to set a rise time of the second signal $\phi 2$ in a three-divided manner during the test or other ration may be desired.

When both the address signals A0 and A1 are at the "H" level, the rise time of the second signal $\phi 2$ is the same as that in an ordinary operation.

Figure 13:
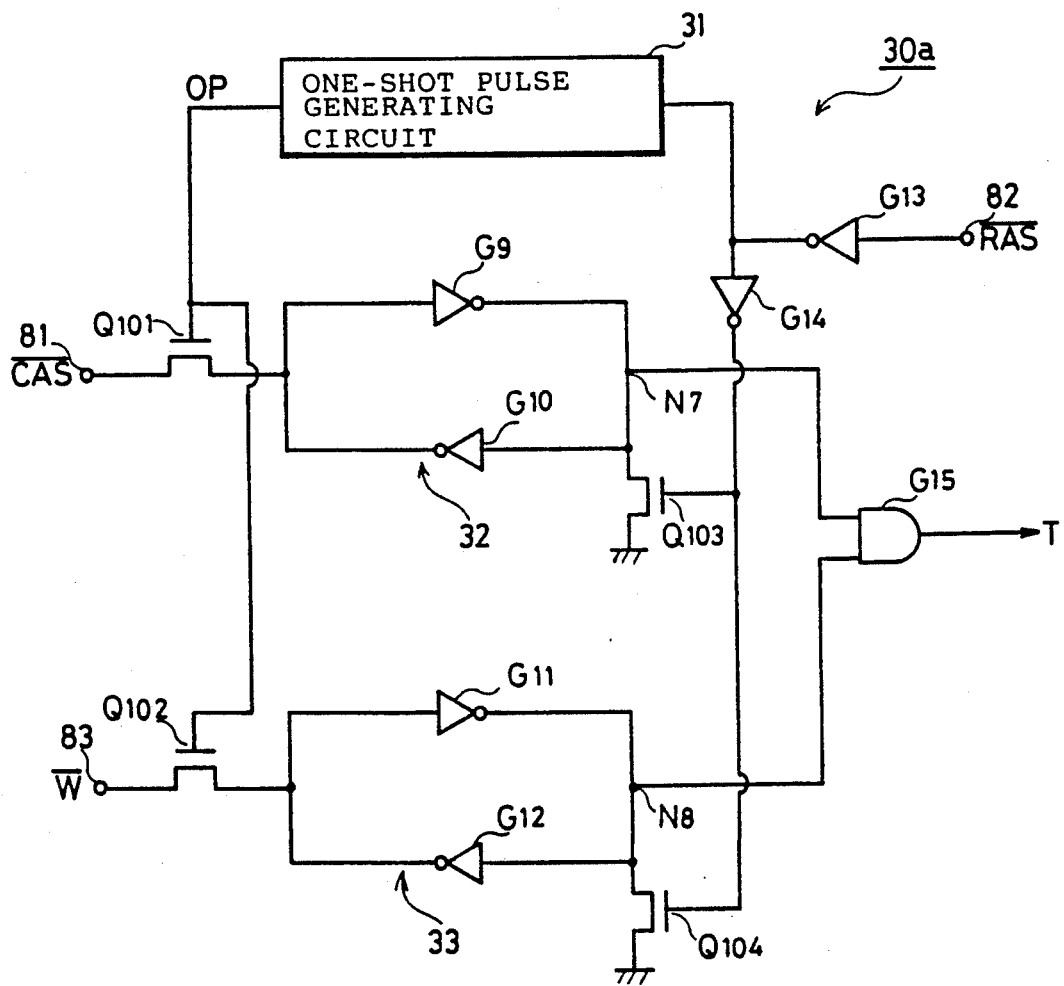
FIG. 13 is a circuit diagram showing an example of a structure of a timing detection circuit.

FIG. 13 is a circuit diagram showing one example of structures of the timing detection circuits 30a shown in FIGS. 2 and 3.

The timing detection circuit 30a shown in FIG. 13 includes n-FETs Q101 - Q104, inverter circuits G9 - G14, an AND circuit 15 and a one-shot pulse generating circuit 31. The inverter circuits G9 and G10 constitute a latch circuit 32, and inverter circuits G11 and G12 constitute a latch circuit 33. The latch circuit 32 is connected via the n-FET Q101 to an external terminal 81 receiving a column address strobe signal $\overline{CAS}$. The latch circuit 33 is connected via the n-FET Q102 to an external terminal 83 receiving a writing signal $\overline{W}$. A row address strobe signal $\overline{RAS}$ is inputted to the one-shot pulse generating circuit 31 via an external terminal 82 and the inverter circuit G13.

The operation of the timing detection circuit 30a will now be explained.

When the row address strobe signal $\overline{RAS}$ applied to the external terminal 82 falls to the "L" level, a single pulse OP is generated from the one-shot pulse generating circuit 31, thereby causing the n-FETs Q101 and Q102 to be turned on. As a result, the column address strobe signal $\overline{CAS}$ and the writing signal $\overline{W}$ applied to the external terminals 81 and 83, respectively, are fetched into the latch circuits 32 and 33, respectively.

Figure 14A:
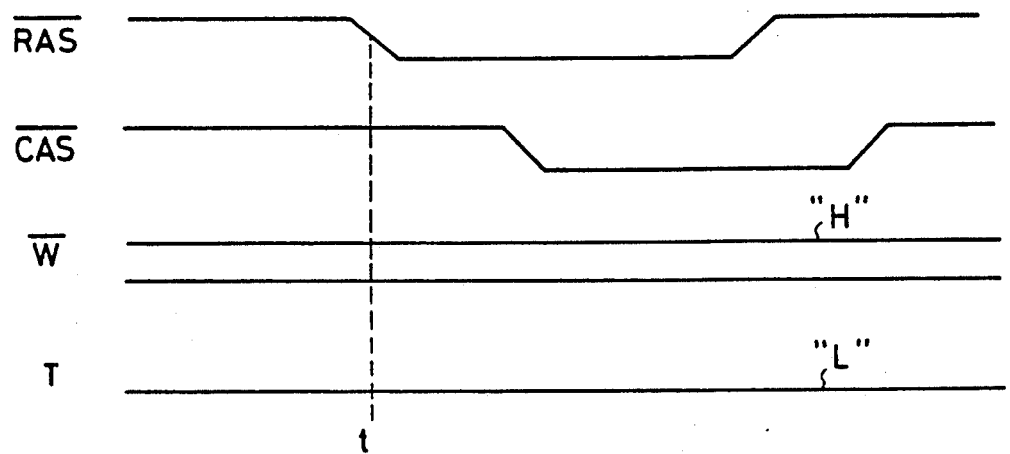
FIG. 14A is a timing chart explaining a timing of a signal in normal operation.

In an ordinary operation, as shown in FIG. 14A, at the time t when the row address strobe signal $\overline{RAS}$ falls to the "L" level, the column address strobe signal $\overline{CAS}$ and the writing signal $\overline{W}$ are at the "H" level. Thus, the potential of nodes N7 and N8 becomes the "L" level, so that the test signal T of the "L" level is outputted from a AND gate 15.

Figure 14B:
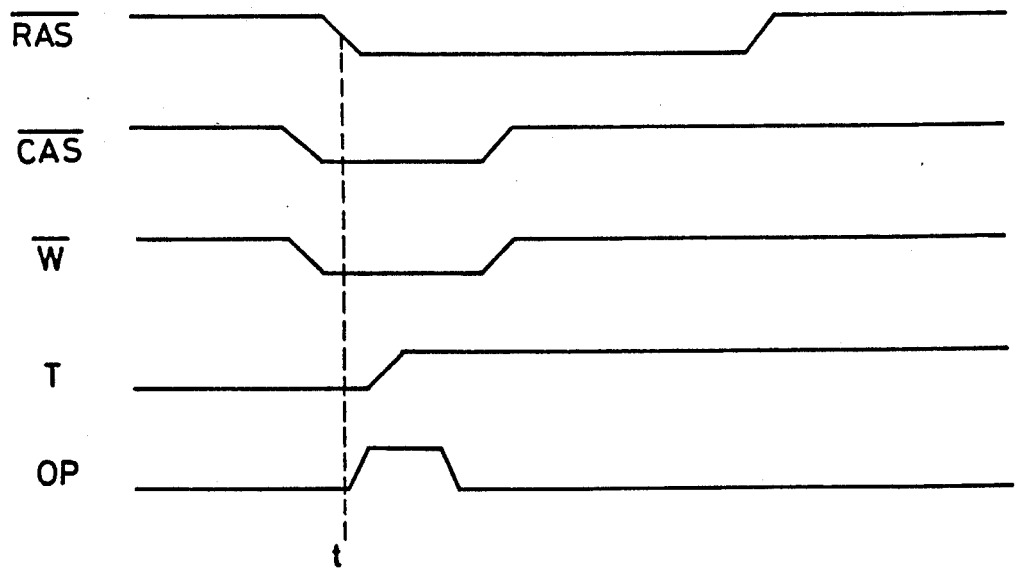
FIG. 14B is a timing chart explaining a timing of a signal in a testing time.

In test, as shown in FIG. 14B, at the time t when the row address strobe signal $\overline{RAS}$ falls to the "L" level, the column address strobe signal $\overline{CAS}$ and the switching signal $\overline{W}$ are set at the "L" level.

Therefore, if the column address strobe signal $\overline{CAS}$ and the writing signal $\overline{W}$ are fetched into the latch circuits 32 and 33, respectively, due to the generation of the signal pulse OP, the potentials of the nodes N7 and N8 attain the "H" level. As a result, a test signal T of the "H" level is generated from the AND circuit G15. The test signal T is applied to the switching signal generating circuit 20b.

Figure 15:
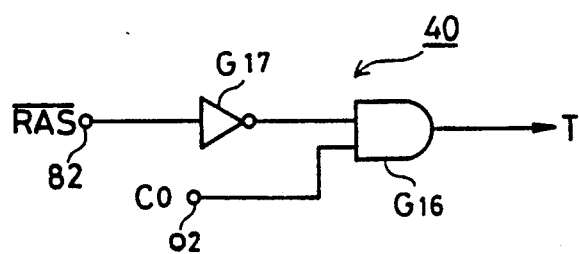
FIG. 15 is a circuit diagram showing a structure of a test signal generation circuit.

FIG. 15 is a circuit diagram showing one example of the structure of the test signal generating circuit 40 shown in FIG. 4.

In FIG. 15, one input terminal of an AND circuit 16 is connected via an inverter circuit 17 to an external terminal 82 receiving a row address strobe signal $\overline{RAS}$. The other input terminal of the AND circuit G16 is connected to the output terminal O2 of the high voltage detection circuit 20 shown in FIG. 10. In the test signal generating circuit 40 shown in FIG. 15, only when the row address strobe signal $\overline{RAS}$ attains the "L" level and the control signal CO applied from the high voltage detection circuit 20 attains the "H" level, a test signal T of the "H" level is generated. The control signal CO corresponds to the control signal $\overline{C}$ in FIG. 10.

Figure 16:
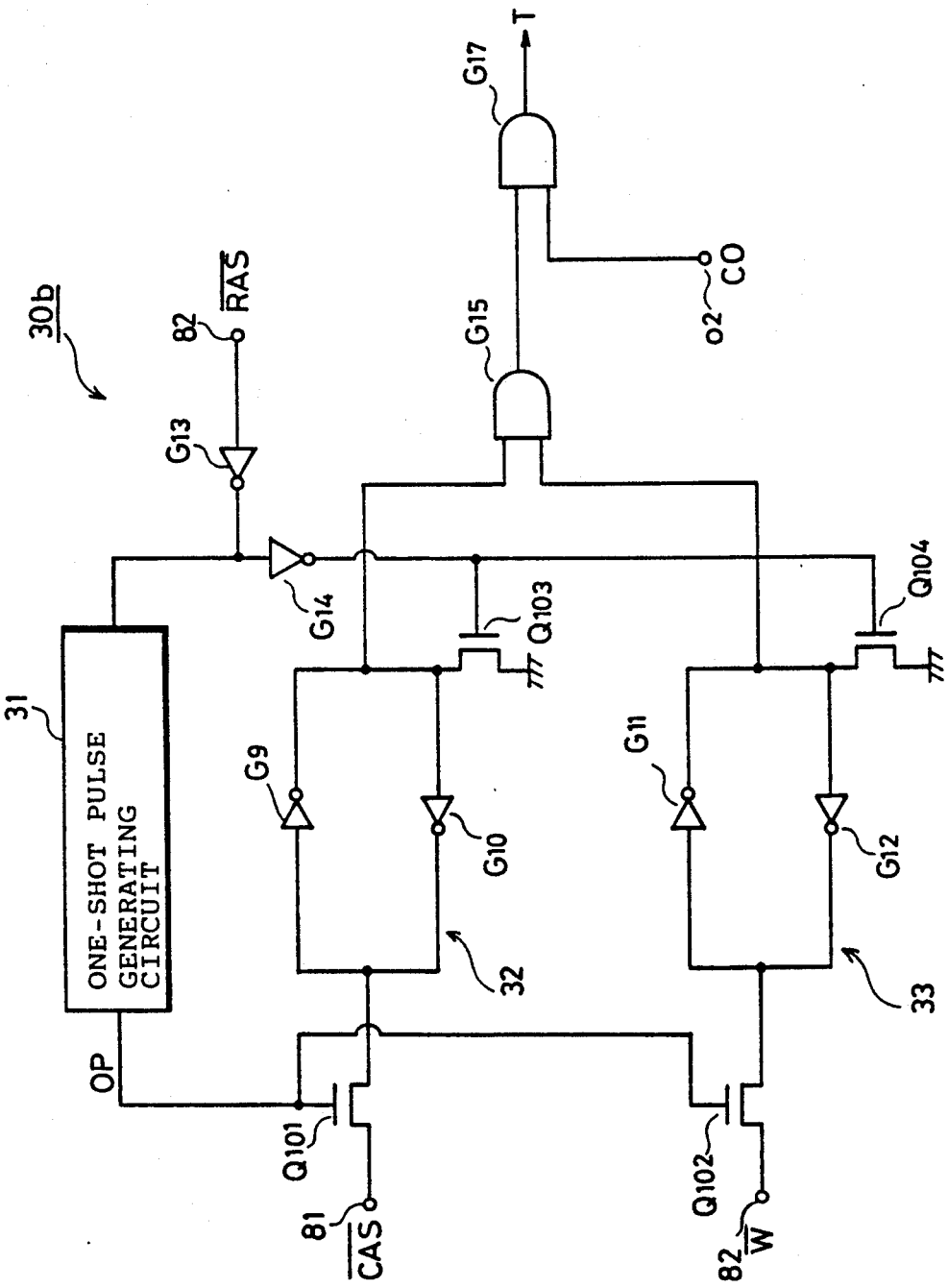
FIG. 16 is a circuit diagram showing another example of a structure of a timing detection circuit.

FIG. 16 is a circuit diagram showing one example of a structure of the timing detection circuit 30b shown in FIG. 5.

Except that an AND 17 is provided in the timing detection circuit 30b in FIG. 16, the timing detection circuit 30b in FIG. 16 is the same as the timing detection circuit 30a shown in FIG. 13. One input terminal of the AND circuit G17 is connected to an output terminal of the AND circuit G15, and the other input terminal of the AND circuit G17 is connected to the output terminal O2 of the high voltage detection circuit 20 shown in FIG. 10.

In the timing detection circuit 30b shown in FIG. 16, only when a column address strobe signal $\overline{CAS}$ and a writing signal $\overline{W}$ are at the "L" level at the fall time of a row address strobe signal $\overline{RAS}$ and a control signal CO applied from the high voltage detection circuit 20 is at the "H" level, a test signal T of the "H" level is generated.

In the above embodiment, an input terminal is used as an external terminal for setting a DRAM in a test state. However, an input/output terminal or an output terminal may be used.

The applications of signal generating circuits shown in FIGS. 1-5 to a generating circuit of a sense amplifier driving signal of a DRAM have been so far described. However, the present invention can be applied to other circuits requiring adjustment of generation timings of signals.

Figure 17:
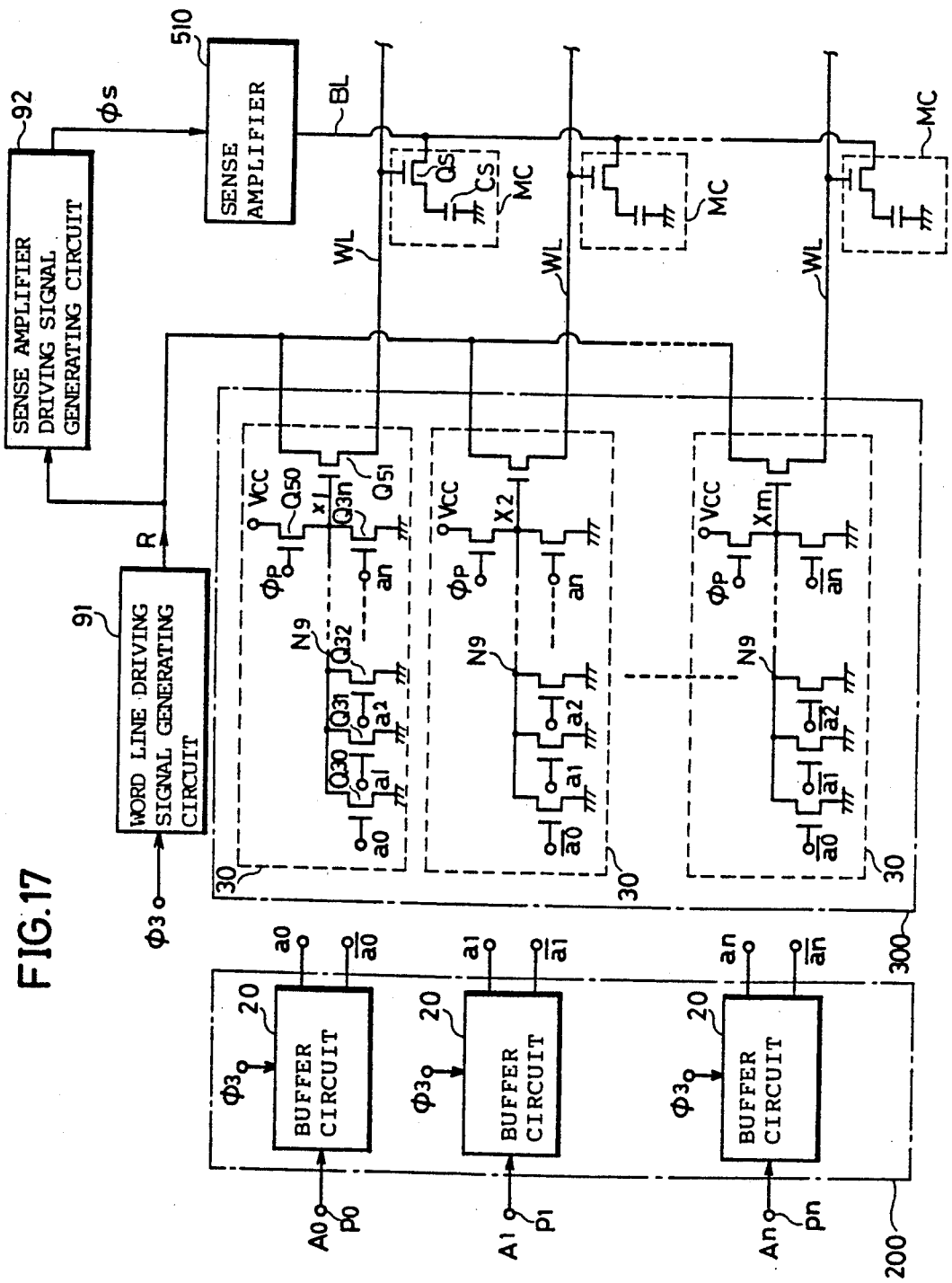
FIG. 17 is a circuit diagram showing a structure mainly of a X decoder of a DRAM.

FIG. 17 is a circuit diagram showing the structure mainly of an address buffer 200 and an X decoder 300 of a DRAM shown in FIG. 20.

The address buffer 200 includes a plurality of buffer circuits 20. Each buffer circuit 20 is provided with external address signals A0-An through external terminals p0-pn, respectively. Each buffer circuit 20 is responsive to a control signal $\phi 3$ for outputting internal address signals a0, $\overline{a0}$, ..., an, $\overline{an}$, respectively. The X decoder 300 includes a plurality of decoder circuits 30. Each decoder circuit 30 includes n-FETs Q30 - Q3n, Q50, Q51. Internal address signals are applied to gates of the n-FETs Q30 - Q3n. The n-FET Q50 is responsive to a precharge signal $\phi p$ for precharging a node N9 to a predetermined potential.

A word line driving signal generating circuit 91 is responsive to the control signal $\phi 3$ for generating a word line driving signal R. The n-FET Q51 in each decoder circuit 30 transmits the word line driving signal R to the corresponding WL when a potential of the node N9 is at the "H" level. A sense amplifier driving signal generating circuit 92 is responsive to the word line driving signal R for generating a sense amplifier driving signal $\phi s$.

Referring now to a timing chart shown in FIG. 18, the operation of the circuits in FIG. 17 will be explained.

When the precharge signal $\phi p$ is at the "H" level, the control signal $\phi 3$ attains the "L" level and the output of the buffer circuit 20 is at the "L" level. The node N9 of each decoder circuit 30 is precharged through the n-FET Q50. When the precharge signal $\phi p$ attains the "L" level, the control signal $\phi 3$ attains the "H" level, so that according to the state of the external address signals A0 -An, the state of the internal address signals a0, $\overline{a0}$-an, $\overline{an}$ outputted from the buffer circuit 20 are determined. These internal signals a0, $\overline{a0}$ -an, $\overline{an}$ are transmitted to the decoder circuits 30.

For example, when all the internal address signals A0–An are at the "L" level, the internal address signals a0–an attain the "L" level, and the internal address signals $\overline{a0}$–$\overline{an}$ attain the "H" level. As a result, the nodes N9 of the decoder circuits 30 other than the most upper one are discharged, so that the potentials X2 - Xm of the nodes N9 attain the "L" level. Since no one of the internal address signals $\overline{a0}$–$\overline{an}$ is applied to the most upper decoder circuit 30, its node N9 is not discharged so that its potential Xl holds the "H" level. Therefore, only the n-FET Q51 in the most upper decoder circuit 30 is turned on, thereby transmitting the word line driving signal R to the word line WL. When the word line driving signal R rises to the "H" level, data are read out onto bit lines BL from memory cells MC connected to the word line WL. The read-out data on the bit lines BL are amplified by a sense amplifier 510. In such a way, reading out data in the memory cells MC is accomplished.

The signal generating circuits shown in FIGS. 1–5 can be applied to the sense amplifier driving signal generating circuit 92 as described above. However, if a word line driving signal R rises to the "H" level before discharging of a node N9 of a decoder circuit 30 is finished, the word line driving signal R rises with an n-FET Q51 turned on. Therefore, the potential of the word lines WL other than a particular word line WL designated by external address signals A0-An rises to the "H" level. As a result, memory cells other than designated memory cell are simultaneously selected. It is called multiple-selection. Accordingly, it is necessary that the word line driving signal R is raised to the "H" level at the timing when discharging of the node N9 in the decoder circuit 30 almost finishes.

Figure 18:
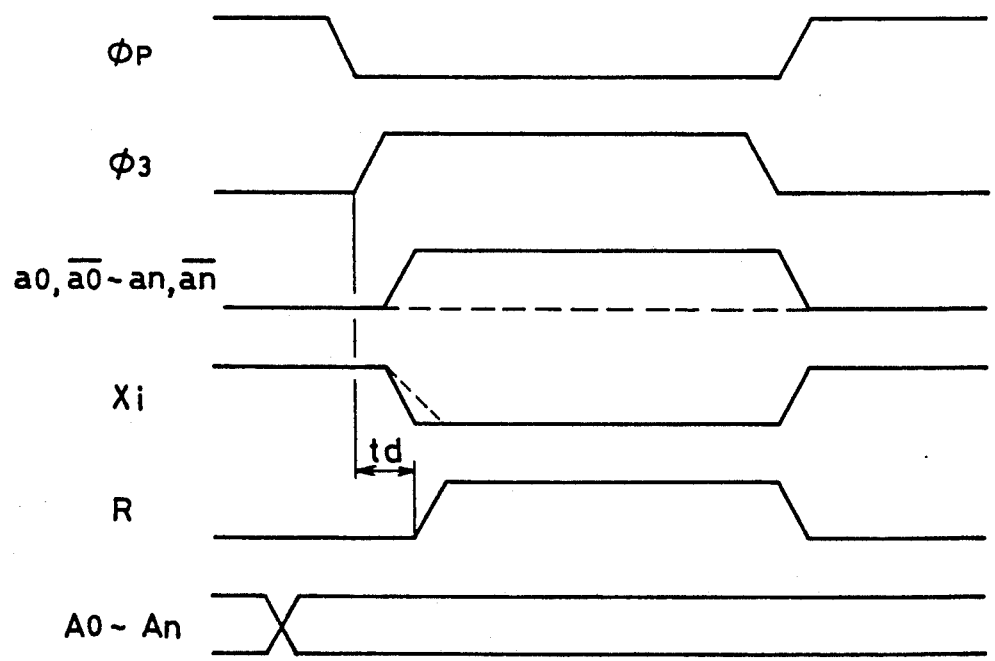
FIG. 18 is a timing chart explaining an operation of a circuit in FIG. 17.

In this case, in FIG. 18, if the time period td from the rise time of the control signal $\phi 3$ to the rise time of the word line driving signal R is made longer, the above described problem will not arise, However, the access time period from the time when addressing is performed by the external address signals, to the time when data of the memory cells are read out will be longer. Accordingly, the timing when the word line driving signal R rises to the "H" level is best set at the time when the discharging of node N9 of the decoder circuit 30 is finished.

In the circuits shown in FIG. 17, if selection of a word line WL by the X decoder 300 is delayed due to the defective properties of one of the n-FETs in the X decoder 300, a word line which should not be selected is selected. As a result, the DRAM malfunctions.

The delay in selecting a word line WL caused by the X decoder 300 is subject to the order for inputting internal address signals and the selection or non-selection of the adjacent decoder circuits 30, so that such a problem of malfunction of the sense amplifier 510 as described above arises. Accordingly, the present invention can be also applied to the word line driving signal generating circuit 91.

Figure 19:
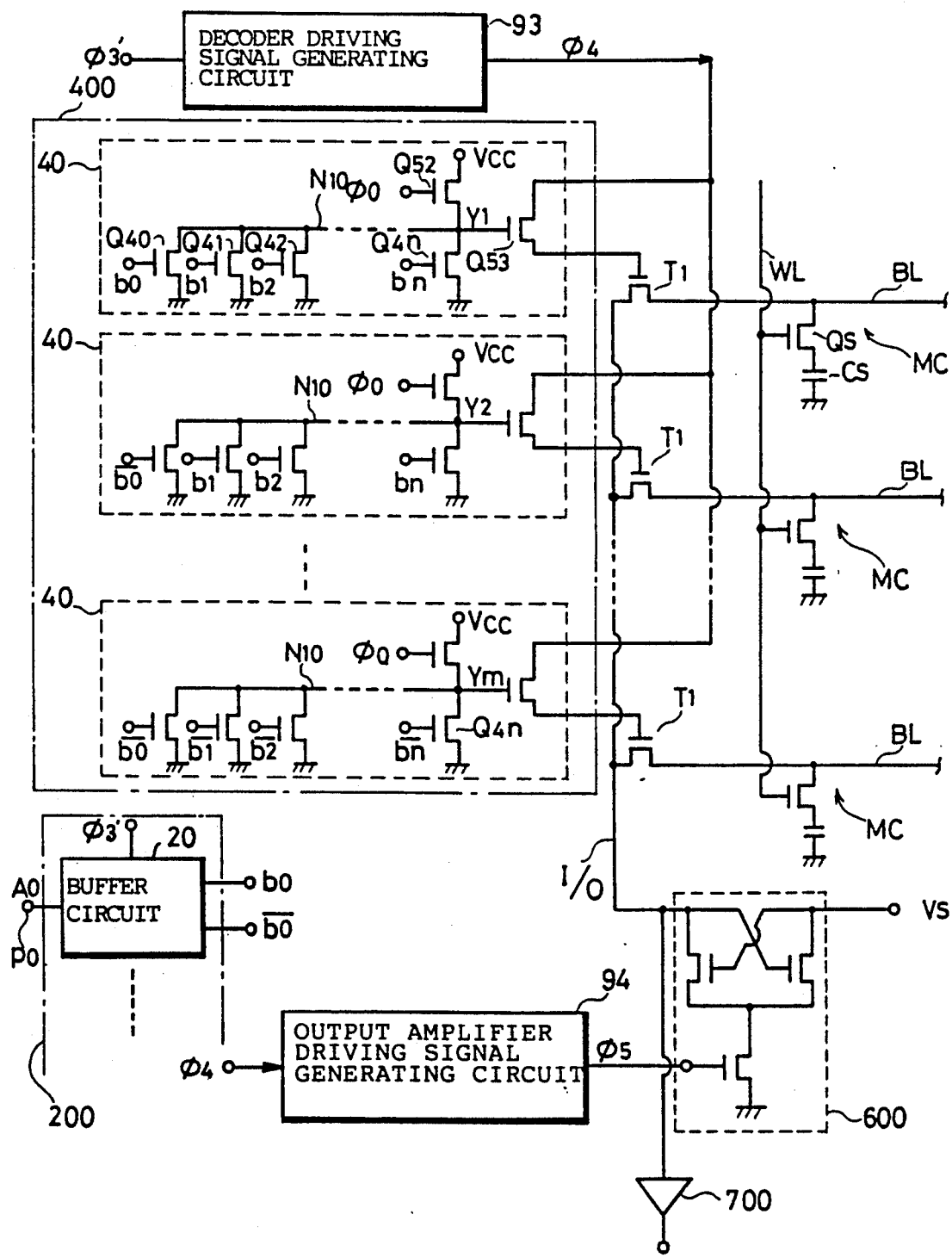
FIG. 19 is a circuit diagram showing a structure mainly of a Y decoder of a DRAM.

FIG. 19 is a circuit diagram showing structures mainly of a Y decoder 400, an output amplifier 600 and a output buffer 700 of a DRAM shown in FIG. 20.

An address buffer 200 is responsive to a control signal $\phi 3'$ for generating internal address signals b0, $\overline{b0}$–bn, $\overline{bn}$. The Y decoder 400 includes a plurality of decoder circuits 40. Each decoder circuit 40 includes n-FETs Q40 - Q4n receiving internal address signals, an n-FET Q52 which is responsive to a control signal $\phi 0$ for precharging a node N10, and an n-FET Q53 receiving the potential of the node N10.

On the other hand, a decoder driving signal generating circuit 93 is responsive to the control signal $\phi 3'$ for generating a control signal $\phi 4$.

In the Y decoder 400, as well as in the X decoder 300, the nodes N10 in the decoder circuits 40 other than that selected by internal address signals are discharged, thereby causing only the n-FET Q53 in the selected decoder circuit 40 to be turned on, so that the control signal $\phi 4$ is transmitted to the corresponding transfer gate T1. In response to the rise of the control signal $\phi 4$ to the "H" level, the transfer gate is turned on, so that the potential of the corresponding bit line BL is transmitted to a data input/output bus I/0.

An output amplifier driving signal generating circuit 94 is responsive to the control signal $\phi 4$ for generating an output amplifier driving signal $\phi 5$. The output amplifier 600 is responsive to the rise of the output amplifier driving signal $\phi 5$ for comparing the data on the data input/output bus I/0 with a reference voltage Vs to amplify it. The output buffer 700 outputs the data amplified by the output amplifier 600.

Also in the circuit shown in FIG. 19, if the control signal $\phi 4$ rises to the "H" level before discharging of nodes N10 in the decoder circuits 40 which are not selected finishes, the data on a plurality of bit lines BL are read out onto the data input/output bus I/0. Accordingly, it is necessary that the control signal $\phi 4$ is raised after discharging of the nodes N10 in the decoder circuits 40 finishes.

Further, if the output amplifier driving signal $\phi 5$ rises before the data on the selected bit line BL are read out onto the data input/output bus I/0, the potential difference between the potential on the data input/output bus I/0 and the reference voltage Vs is not sufficient. Therefore, the output amplifier 600 malfunctions. Accordingly, the output amplifier driving signal $\phi 5$ needs to be raised after reading out data on the bit lines BL onto the data input/output bus I/0 finishes.

If properties of one of the n-FETs in the Y decoders 400 are defective, such a problem as in the X decoder 300 arises. That is, selection of decoder circuits 40 by the Y decoder 400 is delayed, so that decoder circuits 40 which should not be selected is selected, thereby causing the output amplifier 600 to malfunction.

Therefore, the present invention also can be applied to the decoder driving signal generating circuit 93 and the output amplifier driving signal generating circuit 94.

Thus, according to the above described embodiments, it will be possible to test a semiconductor memory devices easily. The signal generating circuits according to the above described embodiments can be also used to determine proper timings for various control signals.

POST DESCRIPTION SUMMARY

As the foregoing, according to the present invention, by setting a state of a signal applied to an external terminal in a predetermined state different from a state in an ordinary operation, a semiconductor memory device can be tested easily in a short time period. Further, since additional external terminals are not required, high packaging density of a semiconductor memory device can be obtained.

What is claimed is:

1. A semiconductor memory device having an external terminal and operating in response to a signal applied to the external terminal, and including a circuit for facilitating detection of a defect in said memory device, said circuit comprising:

test signal generating means responsive to application of a signal of a predetermined state different from a state of an ordinary operation for generating a test signal, first function means for performing an operation in response to a predetermined first signal, delay means receiving said first signal for delaying said first signal by a predetermined delay time period to output the delayed signal as a second signal during a normal operation mode, means responsive to said test signal for changing said delay time period in a test operating mode, second function means for performing an operation in response to said second signal outputted from said delay means and evaluation means for evaluating said operation performed by said second means.

2. A semiconductor memory device according to claim 1, wherein said test signal generating means generates said test signal when voltage of a signal applied to said external terminal is different from voltage in an ordinary operation.

3. A semiconductor memory device according to claim 2, wherein said test signal generating means comprises high voltage detection means responsive to application of voltage higher than voltage of an ordinary logical level to said external terminal for generating said test signal.

4. A semiconductor memory device having an external terminal and operating in response to a signal applied to the external terminal, and including a circuit for facilitating detect of a defect in said memory device, said circuit comprising:

test signal generating means responsive to application of a signal of a predetermined state different from a state of an ordinary operation for generating a test signal, first function means for performing an operation in response to a predetermined first signal, delay means receiving said first signal for delaying said first signal by a predetermined delay time period to output the delayed signal as a second signal during a normal operation mode, means responsive to said test signal for changing said delay time period in a test operating mode, second function means for performing an operation in response to said second signal outputted from said delay means, and evaluation means for evaluating said operation performed by said second means, wherein said test signal generating means generates said test signal when timing of a signal applied to said external terminal is different from a timing in an ordinary operation.

5. A semiconductor memory device having an external terminal and operating in response to a signal applied to the external terminal, and including a circuit for facilitating detection of a defect in said memory device, said circuit comprising:

test signal generating means responsive to application of a signal of a predetermined state different from a state of an ordinary operation for generating a test signal, first function means for performing an operation in response to a predetermined first signal, delay means receiving said first signal for delaying said first signal by a predetermined delay time period to output the delayed signal as a second signal during a normal operation mode, means responsive to said test signal for changing said delay time period in a test operating mode, second function means for performing an operation in response to said second signal outputted from said delay means, and evaluation means for evaluating said operation performed by said second means, wherein said test signal generating means generates said test signal when voltage of a signal applied to said external terminal is different from voltage in an ordinary operation, and a timing of a signal applied to said external terminal is different from a timing in an ordinary operation.

6. A semiconductor memory device according to claim 3, wherein said external terminal comprises first and second external terminals, and said test signal generating means comprises, timing detection means responsive to the fact that timing of a signal applied to said first external terminal and timing of a signal applied to said second external terminal are different from an ordinary timing for generating said test signal.

7. A semiconductor memory device according to claim 4, wherein said external terminal comprises first and second external terminals, said test signal generating means comprises, high voltage detection circuit (20) responsive to application of voltage higher than voltage of an ordinary logical level to said first external terminal for generating a predetermined signal, and timing detection means responsive to the fact that timings of signals applied to said first and second external terminals are different from an ordinary timing and said predetermined signal is applied from said high voltage detection means, for generating said test signal.

8. A semiconductor memory device having an external terminal and operating in response to a signal applied to the external terminal, and including a circuit for facilitating detection of a defect in said memory device, said circuit comprising:

test signal generating means responsive to application of a signal of a predetermined state different from a state of an ordinary operation for generating a test signal, first function means for performing an operation in response to a predetermined first signal, delay means receiving said first signal for delaying said first signal by a predetermined delay time period to output the delayed signal as a second signal during a normal operation mode, means responsive to said test signal for changing said delay time period in a test operating mode, second function means for performing an operation in response to said second signal outputted from said delay means, and evaluation means for evaluating said operation performed by said second means, wherein said external terminal comprises first and second external terminals, and said test signal generating mean comprises,
high voltage detection means responsive to application of voltage higher than that of an ordinary logical level to said first external terminal for generating a predetermined signal, and
logical means responsive to application of a signal of a predetermined logical level to said second external terminal and application of said predetermined signal from said high voltage detection means for generating said test signal.

9. A semiconductor memory device according to claim 1, which further comprises,
switching signal generating means responsive to a predetermined address signal for applying said test signal from said test signal generating means to said delay means.

10. A semiconductor memory device having an external terminal and operating in response to a signal applied to the external terminal, and including a circuit for facilitating detection of a defect in said memory device, said circuit comprising:
test signal generating means responsive to application of a signal of a predetermined state different from a state of an ordinary operation for generating a test signal,
first function means for performing an operation in response to a predetermined first signal,
delay means receiving said first signal for delaying said first signal by a predetermined delay time period to output the delayed signal as a second signal during a normal operation mode, means responsive to said test signal for changing said delay time period in a test operating mode,
second function means for performing an operation in response to said second signal outputted from said delay means,
evaluation means for evaluating said operation performed by said second means,
switching signal generating means responsive to a predetermined address signal and said test signal from said test signal generating means for generating a plurality of switching signals, and
wherein said delay means delays said first signal at a plurality of stages based on said plurality of switching signals.

11. A semiconductor memory device having an external terminal and operating in response to a signal applied to the external terminal, and including a circuit for facilitating detection of a defect in said memory device, said circuit comprising:
test signal generating means responsive to application of a signal of a predetermined state different from a state of an ordinary operation for generating a test signal,
first function mean for performing an operation in response to a predetermined first signal,
delay means receiving said first signal for delaying said first signal by a predetermined delay time period to output the delayed signal as a second signal during a normal operation mode, means responsive to said test signal for changing said delay time period in a test operating mode,
second function means for performing an operation in response to said second signal outputted from said delay means, and
evaluation means for evaluating said operation performed by said second means,
wherein said delay means comprise,
inverting means having input terminals and output terminals,
capacitance means, and
switching means connected between said input terminal or said output terminal of said inverting means and said capacitance means, and being rendered nonconductive in response to said test signal.

12. A semiconductor memory device having an external terminal and operating in response to a signal applied to the external terminal, and including a circuit for facilitating detection of a defect in said memory device, said circuit comprising:
test signal generating means responsive to application of a signal of a predetermined state different from a state of an ordinary operation for generating a test signal,
first function means for performing an operation in response to a predetermined first signal,
delay means receiving said first signal for delaying said first signal by a predetermined delay time period to output the delayed signal as a second signal during a normal operation mode, means responsive to said test signal for changing said delay time period in a test operating mode,
second function means for performing an operation in response to said second signal outputted from said delay means, and
evaluation means for evaluating said operation performed by said second means,
wherein said delay means comprises,
first inverting means,
second inverting means provided in parallel with said first inverting means, and
switching means responsive to said test signal for disabling said second inverting means.

13. A semiconductor memory device having an external terminal and operating in response to a signal applied to the external terminal, and including a circuit for facilitating detection of a defect in said memory device, said circuit comprising:
test signal generating means responsive to application of a signal of a predetermined state different from a state of an ordinary operation for generating a test signal,
first function means for performing an operation in response to a predetermined first signal,
delay means receiving said first signal for delaying said first signal by a predetermined delay time period to output the delayed signal as a second signal during a normal operation mode, means responsive to said test signal for changing said delay time period in a test operating mode,
second function means for performing an operation in response to said second signal outputted from said delay means, and
evaluation means for evaluating said operation performed by said second means,
wherein said delay means comprises,
an input terminal receiving said first signal,
an output terminal,
first nd second transfer gates coupled in parallel between in said input terminal and said output terminal, and
delay circuits coupled between said first transfer gate and said input terminal or said output terminal,
said second transfer gate being rendered conductive in response to said test signal.

14. A semiconductor memory device according to claim 10, wherein
said delay means comprises,
inverting means having an input terminal and an output terminal,
a plurality of capacitance means, and
switching means connecting or non-connecting any of said plurality of capacitance means to an internal terminal or an output terminal of said inverting means based on said plurality of switching signals from said switching signal generating means.

15. A semiconductor memory device according to claim 1, which further comprises,
a memory cell array including a plurality of bit line pairs, a plurality of word lines arranged so as to intersect with said plurality of bit line pairs, and a plurality of memory cells provided at intersections between said plurality of bit line pairs and said plurality of word lines,
a plurality of sense amplifier amplifying potential difference on said plurality of bit line pairs
an address buffer receiving an address signal from the external,
input/output line pair
an X decoder receiving an address signal from said address buffer, and selecting any of said plurality of word lines,
a Y decoder receiving an address signal from said address buffer, selecting any of said plurality of bit line pairs and connecting the selected bit line pairs to said input/output line pair
an output amplifier amplifying a signal on said input-/output line pair,
a word line driving signal generating circuit responsive to a predetermined control signal for applying a word line driving signal to said X decoder,
a sense amplifier driving signal generating circuit responsive to said word line driving signal for applying a sense amplifier activating signal to said plurality of sense amplifiers,
a decoder driving signal generating circuit responsive to a predetermined signal for applying a decoder driving signal to said Y decoder, and
an output amplifier driving signal generating circuit responsive to said decoder driving signal for applying an output amplifier driving signal said output amplifier.

16. A semiconductor memory device according to claim 15, wherein
said first function means is said X decoder,
said delay means is said sense amplifier driving signal generating circuit, and
said second function means and said evaluation means are comprised of said plurality of sense amplifiers.

17. A semiconductor memory device according to claim 15, wherein
said first function means is said address buffer
said delay means is said word line driving signal generating circuit,
said second function means is said X decoder and
said evaluation means is comprised of said plurality of memory cells and said plurality of sense amplifier.

18. A semiconductor memory device according to claim 15, wherein
said first function means is said Y decoder,
said delay means is said output amplifier driving signal generating circuit, and
said second function means and said evaluation means are comprised of said output amplifier.

19. A semiconductor memory device according to claim 15, wherein
said first function means is said address buffer
said delay means is said decoder driving signal generating circuit,
said second function means is said Y decoder, and
said evaluation means is comprised of said plurality of memory cells and said output amplifier.

20. A semiconductor memory device having an external terminal and operating in response to a signal applied to the external terminal, and including a circuit for facilitating detection of a defect in said memory device, said circuit comprising:
test signal generating means responsive to application of a signal of a predetermined state different from a state of an ordinary operation for generating a test signal,
first function means for performing an operation in response to a predetermined first signal,
delay means receiving in said first signal for delaying said first signal by a predetermined delay time period to output the delayed signal as a second signal during a normal operation mode, means responsive to said test signal for changing said delay time period in a test operating mode, and
evaluation means for evaluating said operation performed by said second means.

21. A method of operating a semiconductor memory device in a test mode, comprising an external terminal receiving an external signal; first function means for performing an operation in response to a predetermined first signal, delay means receiving said first signal, delaying the first signal by a predetermined delay time period and outputting the delayed signal as a second signal; and second function means for performing an operation in response to said second signal outputted from said delay means,
the steps of:
generating a test signal in response to application of a signal of a predetermined state different from an ordinary operating state to said external terminal, and
changing said delay time period in response to said test signal.

22. A method for operating, in a test mode, a circuit which includes means for introducing a nominal time delay period to insure correct operation of a function which is subject to variation in completion time during normal operation and wherein said completion time is subject to extension by the presence of a defect, including the steps of
establishing a test mode and producing a test signal in response thereto,
decreasing said nominal delay in response to said test signal to a decreased nominal time delay period sufficiently short to isolate completion time durations of said function due to said defect from normal variations in said completion time.

23. A method as recited in claim 22, wherein the duration of said decreased nominal delay period is approximately one half the duration of said nominal time delay period.

24. A method as recited in claim 22, wherein said step of establishing a test mode includes the step of applying at least one abnormal signal to at least one terminal of said circuit.

25. A method as recited in claim 24, wherein said at least one abnormal signal comprises a voltage above the supply voltage of said circuit to a predetermined terminal of said circuit.

26. A method as recited in claim 24, wherein said at least one abnormal signal comprises an abnormal sequence of signals.

* * * * *